US010191665B2

(12) United States Patent
Chae

(10) Patent No.: US 10,191,665 B2
(45) Date of Patent: Jan. 29, 2019

(54) MEMORY DEVICE FOR HIGH SPEED DATA TRANSFER

(71) Applicant: SK hynix Inc., Gyeonggi-do (KR)

(72) Inventor: Kyeong Min Chae, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 106 days.

(21) Appl. No.: 15/395,698

(22) Filed: Dec. 30, 2016

(65) Prior Publication Data

US 2018/0004429 A1 Jan. 4, 2018

(30) Foreign Application Priority Data

Jul. 4, 2016 (KR) .................. 10-2016-0084397

(51) Int. Cl.
G06F 12/00 (2006.01)
G06F 13/00 (2006.01)
G06F 3/06 (2006.01)
G11C 7/10 (2006.01)
G11C 7/14 (2006.01)
G11C 7/22 (2006.01)
G11C 8/10 (2006.01)
G11C 16/26 (2006.01)
G11C 16/32 (2006.01)
G11C 16/04 (2006.01)

(52) U.S. Cl.
CPC ............ *G06F 3/0611* (2013.01); *G06F 3/068* (2013.01); *G06F 3/0656* (2013.01); *G11C 7/10* (2013.01); *G11C 7/106* (2013.01); *G11C 7/1039* (2013.01); *G11C 7/1066* (2013.01); *G11C 7/14* (2013.01); *G11C 7/222* (2013.01); *G11C 8/10* (2013.01); *G11C 16/26* (2013.01); *G11C 16/32* (2013.01); *G11C 16/0483* (2013.01)

(58) Field of Classification Search
CPC ...... G06F 3/0611; G06F 3/0656; G06F 3/068; G11C 7/10; G11C 7/1039; G11C 7/14; G11C 7/222; G11C 8/10
USPC .......................................................... 711/167
See application file for complete search history.

(56) References Cited

U.S. PATENT DOCUMENTS 5,384,737 A * 1/1995 Childs .................. G11C 7/1039
365/189.04
5,440,514 A * 8/1995 Flannagan ............... G11C 7/22
327/158
5,740,123 A * 4/1998 Uchida ..................... G11C 7/22
365/194

(Continued)

FOREIGN PATENT DOCUMENTS

KR 1020140088730 7/2014
KR 1020150143943 12/2015

Primary Examiner — Sheng Jen Tsai
(74) Attorney, Agent, or Firm — IP & T Group LLP

(57) ABSTRACT

A memory device may include a data output controller for generating a first clock signal and a second clock signal in response to a read enable clock signal, a page buffer for storing data, and outputting the data to the data output controller in synchronization with the first clock signal, and a data output buffer for receiving the data from the page buffer and outputting the received data to the external device in synchronization with the second clock signal. The first clock signal is generated in response to a data output delay control signal, the second clock signal is generated irrespective of the data output delay control signal.

18 Claims, 17 Drawing Sheets

(56) References Cited

U.S. PATENT DOCUMENTS

| | | | | |
|---|---|---|---|---|
| 6,101,136 A * | 8/2000 | Mochida | G11C 7/1018 | 365/194 |
| 6,215,726 B1 * | 4/2001 | Kubo | G11C 7/1006 | 327/141 |
| 6,222,406 B1 * | 4/2001 | Noda | G11C 7/1078 | 327/269 |
| 6,333,895 B1 * | 12/2001 | Hamamoto | G11C 7/1051 | 365/226 |
| 6,529,423 B1 * | 3/2003 | Yoon | G11C 7/22 | 365/194 |
| 6,763,443 B1 * | 7/2004 | Clark | G06F 13/1689 | 365/222 |
| 2002/0093871 A1 * | 7/2002 | Kwak | G11C 7/1045 | 365/233.1 |
| 2002/0140471 A1 * | 10/2002 | Fiscus | G11C 7/22 | 327/158 |
| 2003/0002357 A1 * | 1/2003 | Kwon | G11C 7/22 | 365/194 |
| 2003/0128597 A1 * | 7/2003 | Jun | G11C 7/1051 | 365/194 |
| 2004/0052152 A1 * | 3/2004 | Kono | G11C 7/1066 | 365/233.1 |
| 2004/0066700 A1 * | 4/2004 | Lee | G11C 7/1021 | 365/232 |
| 2005/0122796 A1 * | 6/2005 | Jung | G11C 7/1072 | 365/194 |
| 2005/0128828 A1 * | 6/2005 | Lee | G11C 7/1039 | 365/194 |
| 2007/0070676 A1 * | 3/2007 | Kim | G11C 7/1039 | 365/78 |
| 2007/0147167 A1 * | 6/2007 | Chu | G11C 7/1051 | 365/233.16 |
| 2007/0286012 A1 * | 12/2007 | Lee | G11C 7/1051 | 365/233.1 |
| 2009/0040847 A1 * | 2/2009 | Lee | G11C 7/1051 | 365/194 |
| 2009/0146716 A1 * | 6/2009 | Ide | G11C 7/1072 | 327/276 |
| 2010/0315139 A1 * | 12/2010 | Kim | G11C 7/1066 | 327/158 |
| 2011/0116330 A1 * | 5/2011 | Kim | G11C 7/22 | 365/194 |
| 2011/0310681 A1 * | 12/2011 | Hirobe | G11C 7/10 | 365/189.17 |
| 2015/0371692 A1 * | 12/2015 | Song | G11C 7/222 | 365/189.05 |

* cited by examiner

FIG. 4

| CKCOL_DOUT FIRST RISING (rising) | SET VALUE OF DATA OUTPUT DELAY SIGNAL (LAT_OUT<1:0>) ||||
|---|---|---|---|---|
| | 00 | 01 | 10 | 11 |
| | RE_N_INT SECOND RISING | RE_N_INT SECOND RISING | RE_N_INT FOURTH RISING | RE_N_INT SIXTH RISING |

FIG. 5

| POUT_B0<3:0> INITIAL VALUE | SET VALUE OF DATA OUTPUT DELAY SIGNAL(LAT_OUT<1:0>) ||||
|---|---|---|---|---|
| | 00 | 01 | 10 | 11 |
| | 0001 | 1000 | 1000 | 0100 |

FIG. 6

| POUT_B1<3:0> INITIAL VALUE | SET VALUE OF DATA OUTPUT DELAY SIGNAL (LAT_OUT<1:0>) ||||
|---|---|---|---|---|
| | 00 | 01 | 10 | 11 |
| | 0001 | 1000 | 1000 | 0100 |

FIG. 7

| INITIAL BANK SELECT OF PIPE LATCH | SET VALUE OF DATA OUTPUT DELAY SIGNAL (LAT_OUT<1:0>) ||||
|---|---|---|---|---|
| | 00 | 01 | 10 | 11 |
| | SEL_B0 | SEL_B1 | SEL_B0 | SEL_B0 |

FIG. 14

| CLK_CNTL INITIAL STATUS | SET VALUE OF DATA INPUT SIGNAL (LAT_IN<1:0>) | | | |
|---|---|---|---|---|
| | 00 | 01 | 10 | 11 |
| | HIGH | LOW | HIGH | HIGH |

FIG. 15

| SEL_ENH_B0 CKCOL_DIN_B0 | SET VALUE OF DATA INPUT SIGNAL (LAT_IN<1:0>) | | | |
|---|---|---|---|---|
| | 00 | 01 | 10 | 11 |
| | DQS_DP SECOND FALLING | DQS_DP THIRD FALLING | DQS_DP FOURTH FALLING | DQS_DP SIXTH FALLING |

MEMORY DEVICE FOR HIGH SPEED DATA TRANSFER

CROSS-REFERENCE TO RELATED APPLICATION

The present application claims priority under 35 U.S.C. § 119(a) to Korean patent application number 10-2016-0084397 filed on Jul. 4, 2016, which is herein incorporated by reference in its entirety.

BACKGROUND

Field of Invention

Embodiments of the present disclosure relate to a memory device having an input/output (I/O) delay setting for high speed data transfer and, more particularly, to a data I/O delay setting device for high speed data transfer in the memory device.

Description of Related Art

As demand for mobile phones, portable memory devices and digital cameras increases, demand for nonvolatile memory devices employed in such electronic devices is increasing as well. Among the various types of nonvolatile memory devices, NAND flash memory devices are in wide use as data storage devices.

NAND flash memory devices include data transmission devices needed to receive data through I/O pins from external devices or to output data through I/O pins to external devices.

Recently, as the portability of digital devices improves, the amount of data usage is also gradually increasing. Thus, smaller and faster memory devices are in demand.

SUMMARY

Embodiments of the present disclosure are directed to a data input/output (I/O) delay setting device capable of improving the data I/O speed of a memory device and a data transmission device including the same.

According to an embodiment of the present disclosure, there is provided a memory device comprising: a data output controller configured to generate first and second clock signals in response to a read enable clock signal received from an external device during a data output operation, a page buffer configured to output data to the data output controller In synchronization with the first clock signal, and a data output buffer configured to receive the data from the page buffer and to output the received data to the external device in synchronization with the second clock signal, wherein the first clock signal is generated in response to a data output delay control signal, the second clock signal is generated irrespective of the data output delay control signal, and a time point of outputting the data to the external device is changed according to a set value of the data output delay control signal.

According to an embodiment of the present disclosure, there is provided a memory device including: a data input buffer configured to receive a data strobe clock signal and data in synchronization with the data strobe clock signal from an external device during a data input operation, and to generate a first clock signal in response to the data strobe clock signal; a data input delay controller configured to receive the data output from the data input buffer in synchronization with the first clock signal, and to generate one or more second clock signals in response to the first clock signal and under a control by a data input delay signal; and a page buffer configured to receive the data from the data input delay controller, and to store the data in synchronization with the one or more second clock signals, wherein the first clock signal is generated irrespective of the data input delay signal.

According to another embodiment of the present disclosure, there is provided a memory device including: a data input buffer for generating a first clock signal in synchronization with a read enable clock signal received from an external device during a data output operation; a data output controller for generating a second clock signal and a third clock signal in synchronization with the first clock signal; a column address generation controller for generating and changing a column address in synchronization with the second clock signal; a page buffer for storing data, and outputting the data to the data output controller in synchronization with the second clock signal and in response to the column address; and a data output buffer for receiving the data output from the data output controller and outputting the received data to the external device in synchronization with the third clock signal. The second clock signal is generated in response to a data output delay control signal, the first clock signal and the third clock signal are generated irrespective of the data output delay control signal, and when the data is being output to the external device, a time point of outputting the data changes according to a set value of the data output delay control signal.

According to another embodiment of the present disclosure, there is provided a memory device including: a data input buffer for receiving a data strobe clock signal and data in synchronization with the data strobe clock signal from an external device during a data input operation, and generating a first clock signal in response to the data strobe clock signal; a data input delay controller for receiving the data output in synchronization with the first clock signal from the data input buffer, and generating a second clock signal and a third clock signal in response to the first clock signal and under a control by a data input delay signal; a column address generation controller for generating and changing a column address in response to the third clock signal; and a page buffer for receiving the data from the data input delay controller, and storing the data in synchronization with the second clock signal and in response to the column address. The first clock signal is generated irrespective of the data input delay signal, and when the data is being received from the external device, a portion of the data having a certain size is processed as dummy data instead of being stored in the page buffer according to a set value of the data input delay signal.

This technology may improve the data input/output (I/O) speed through a new type of data I/O delay setting device. Accordingly, the operating speed of a memory device may improve.

BRIEF DESCRIPTION OF THE DRAWINGS

Example embodiments will now be described more fully hereinafter with reference to the reference to the accompanying drawings; however, they may be embodied in different forms and should not be construed as being limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present between the two elements. Like reference numerals refer to like elements throughout.

FIG. 4 is a diagram illustrating a method for controlling a data output delay clock signal according to a set value of the data output delay signal;

FIG. 5 is a diagram illustrating a method for controlling a first pipe output bank signal according to a set value of a data output delay signal;

FIG. 6 is a diagram illustrating a method for controlling a second pipe output bank signal according to a set value of a data output delay signal;

FIG. 7 is a diagram illustrating a method for controlling a first pipe select bank signal and a second pipe select bank signal according to a set value of a data output delay signal;

FIG. 14 is a diagram illustrating a method for controlling a control clock signal according to a set value of a data input delay signal;

FIG. 15 is a diagram illustrating a method for controlling a first bank data input select signal and a first bank data input delay clock signal according to a set value of a data input delay signal;

DETAILED DESCRIPTION

Figure 1:
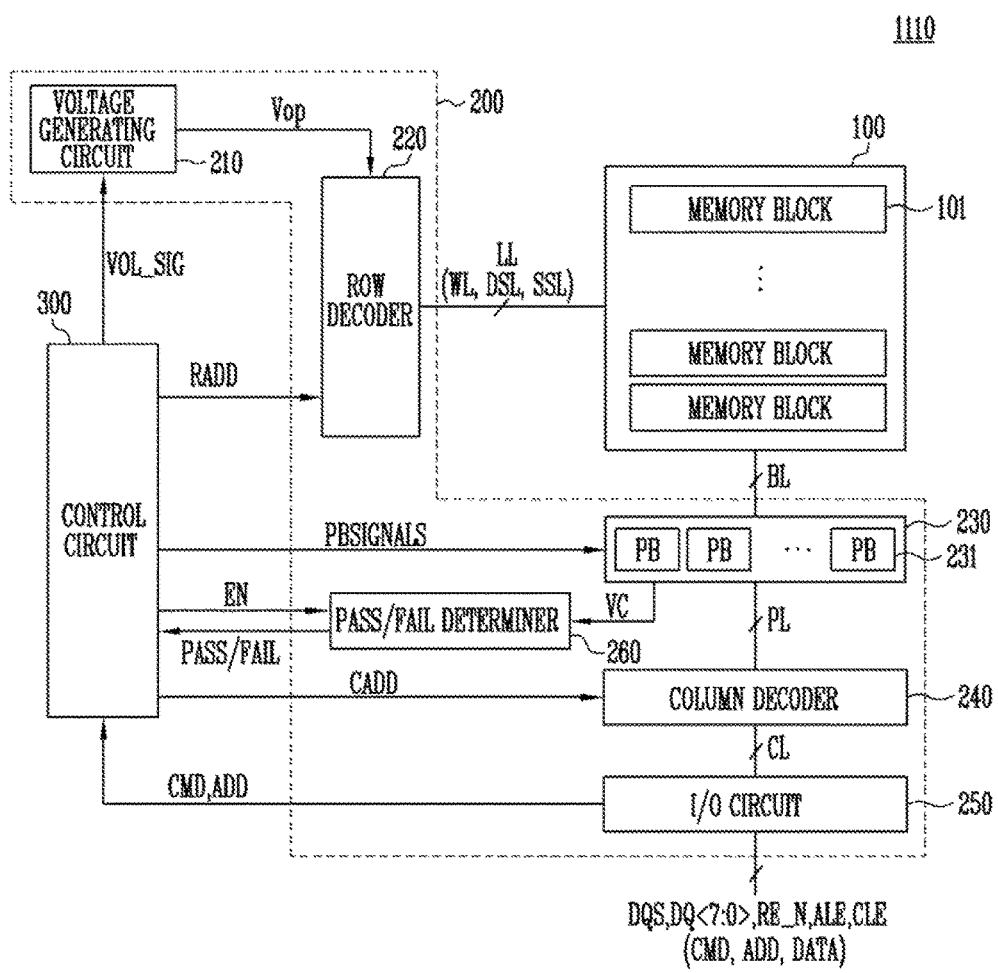
FIG. 1 is a diagram illustrating a memory device according to an embodiment of the present disclosure.

Hereinafter, embodiments will be described in greater detail with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as being limited to the particular shapes of regions illustrated herein but may include deviations in shapes that result, for example, from manufacturing. In the drawings, lengths and sizes of layers and regions may be exaggerated for clarity. Like reference numerals in the drawings denote like elements. It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

FIG. 1 is a diagram illustrating a memory device according to an embodiment of the present disclosure.

Referring to FIG. 1, the memory device 1110 may include a memory cell array 100 for storing data, a peripheral circuit 200 and a control circuit 300 that controls the peripheral circuit 200. The peripheral circuit may be configured to program data in the memory cell array 100, to read stored data from the memory cell array 100 and output the read data to an external device, or to erase the stored data in the memory cell array 100.

The memory cell array 100 may include a plurality of memory blocks 101. To each of the memory blocks 101, local lines LL and bit lines BL may be connected. Each local line LL is each connected to a respective memory block among the plurality of memory blocks 101. Each bit line BL is commonly connected to the plurality of memory blocks 101. Each memory block may include a plurality of memory cells organized in a plurality of pages. A page may be defined as a plurality of memory cells controlled by the same word line. Further, the memory cell array 100 may include a main data area that stores user data and a spare area that stores spare data. The memory cell array 100 may be configured as a three-dimensional memory array having a form where memory cells are stacked on a substrate in a vertical direction.

The peripheral circuit 200 may include a voltage generating circuit 210, a row decoder 220, a page buffer 230, a column decoder 240, an input/output (I/O) circuit 250 and a pass/fail determiner 260.

The voltage generating circuit 210 may generate various operating voltages Vop being used to a program, a read or an erase operation in response to a voltage generating signal VOL_SIG received form the control circuit 300. For example, the voltage generating circuit 210 may generate program voltages, pass voltages, read voltages and erase voltages having various levels in response to the voltage generating signal VOL_SIG.

The row decoder 220 may provide the received operating voltages Vop to the local lines LL connected to the memory block among the plurality of memory blocks selected in response to a row address RADD. For example, the row decoder 220 may provide the operating voltages Vop to a selected word line WL of the local lines. Further, the row decoder 220 may provide the operating voltages Vop to a drain select line DSL and a source select line SSL connected to the selected memory block among the plurality of memory blocks, besides the word lines WL.

The page buffer 230 may include a plurality of page buffers (PBs) 231 connected to the bit lines BL. The page buffers 231 may transmit and receive data to and from a selected memory region of the memory cell array 100 through the bit lines BL, and temporarily store data received from the selected memory region. A selected memory region may be, for example, a page of a memory block.

The column decoder 240 may receive data from the page buffer 230 through a plurality of page lines PL in response to a column address CADD.

The I/O circuit 250 may transmit data DATA received from an external device such as a memory system controller through data I/O pins DQ<7:0> to the column decoder 250 through column lines CL. Here, the data being received through the data I/O pins DQ<7:0> may be in synchronization with a read enable clock signal RE_N. Further, the I/O circuit 250 may output or transmit the data DATA received from the column decoder 240 through the column lines CL to an external device (not shown) through the I/O pins DQ<7:0>. Here, the data being output from the I/O circuit 250 may be output in synchronization with a data strobe clock signal DQS.

In a section or period where a command latch enable signal CLE is activated, the I/O circuit 250 may receive a command (CMD) from the external device, and transmit the command to the control circuit 300. In a period where an address latch enable signal ALE is activated, the I/O circuit 250 may receive an address (ADD) from the external device and transmit the address to the control circuit 300.

The pass/fail determiner 260 may determine whether an operation being performed is a pass or fail according to a voltage VC or current received from the page buffer 230 in response to an enable signal EN, and transmit a pass signal PASS or a fall signal FAIL indicating a result of the operation performed to the control circuit 300.

The control circuit 300 may output the voltage generating signal VOL_SIG, the row address RADD, the page buffer control signal PBSIGNALS, the enable signal EN and the column address CADD, and control the peripheral circuit 200 in response to the command CMD and the address ADD received from the I/O circuit 250.

Figure 2:
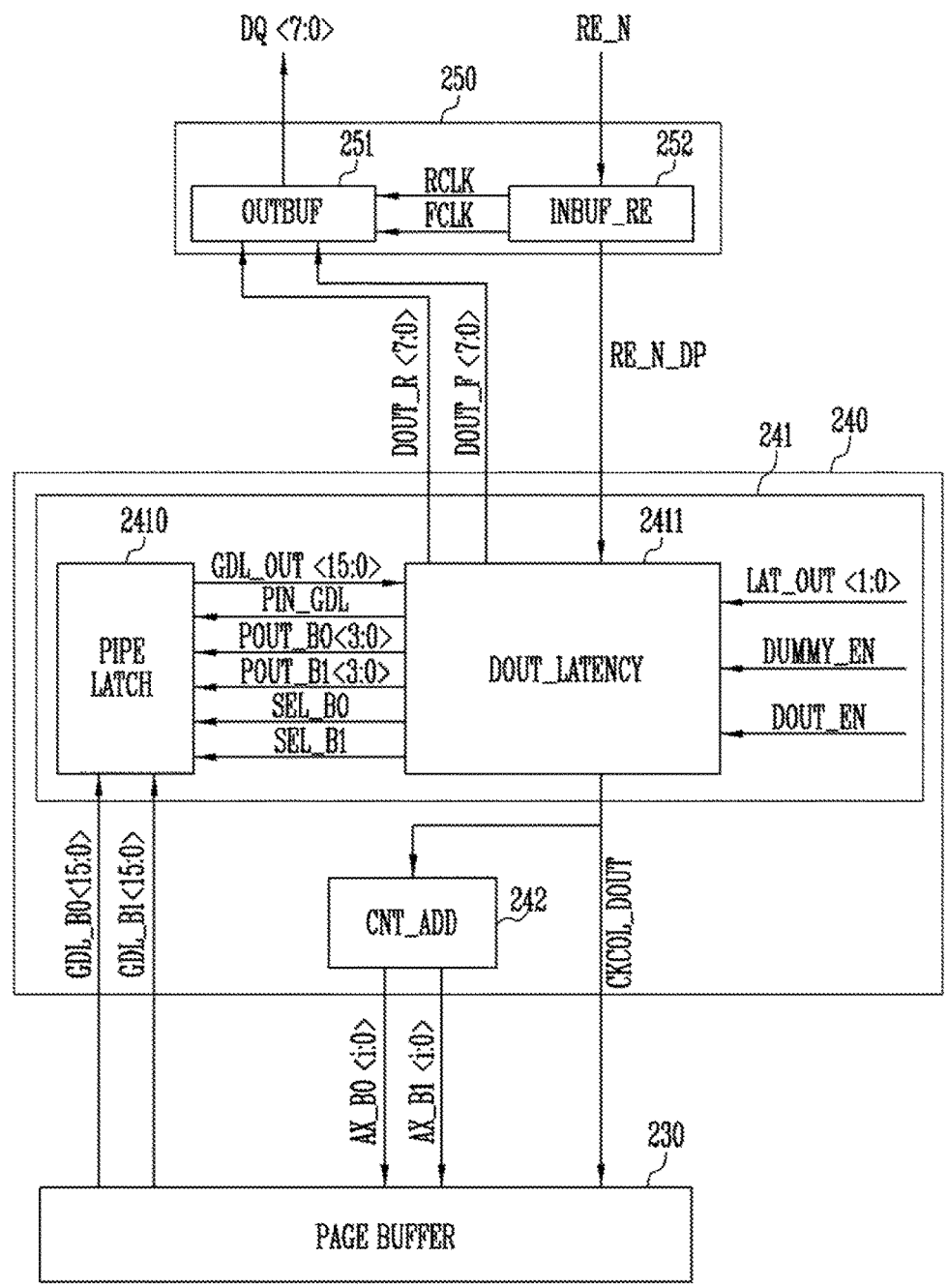
FIG. 2 is a diagram illustrating the peripheral circuit of FIG. 1 according to an embodiment of the present disclosure.

FIG. 2 is a diagram illustrating the peripheral circuit 200 of FIG. 1 according to an embodiment of the present disclosure.

Referring to FIG. 2, the I/O circuit 250 may include a data output buffer OUTBUF 251 and a clock input buffer INBUF_RE 252. The clock input buffer INBUF_RE 252 may receive input of a read enable clock signal RE_N being supplied from the external device. In some embodiments, the read enable clock signal RE_N may continue clocking in a data output operation period, but in a period other than the data output operation period, the read enable clock signal RE_N may be maintained at a certain level or at a floating state. The clock input buffer INBUF_RE 252 may buffer the read enable clock signal RE_N, and generate and output a data pass sync strobe clock signal RE_N_DP. When generating the data pass sync strobe clock signal RE_N_DP from the read enable clock signal RE_N, without being controlled by a data output delay signal LAT_OUT<1:0>, the data pass sync strobe clock signal RE_N_DP may be generated directly from the read enable clock signal RE_N, and thus, there may be very little time delay between the read enable clock signal RE_N and the data pass sync strobe clock signal RE_N_DP. Consequently, a timing margin in the data output operation may be improved, thereby enabling high speed data outputting operations.

The clock input buffer INBUF_RE 252 may generate and output a rising sync clock RCLK that includes a pulse in synchronization with a rising edge of the read enable clock signal RE_N, and a falling sync clock FCLK that includes a pulse in synchronization with a falling edge of the read enable clock signal RE_N.

The column decoder 240 may include a data output controller 241 and a column address generation controller CNT_ADD 242. The data output controller 241 may include a pipe latch PIPE LATCH 2410 and a data output delay controller DOUT_LATENCY 2411.

The data output delay controller DOUT_LATENCY 2411 may receive the data pass sync strobe clock signal RE_N_DP and generate a data output delay clock signal CKCOL_DOUT. The operating method of the data output delay clock signal CKCOL_DOUT may differ depending on the data output delay signal LAT_OUT<1:0>. The data output delay clock signal CKCOL_DOUT may play the role of controlling data output delay in a data output operation. Further, the data output delay clock signal CKCOL_DOUT may perform clocking irrespective of the read enable clock signal RE_N in a period where a dummy read enable signal DUMMY_EN is activated before the data output operation starts. Further, during the data output operation, the data output delay clock signal CKCOL_DOUT perform clocking in synchronization with the read enable clock signal RE_N. A clocking cycle of the data output delay clock signal CKCOL_DOUT during the data output operation may be twice the clocking cycle of the data pass sync strobe clock signal RE_N_DP. Consequently, a more stabilized operation may be possible during a high speed data output operation. The data output delay signal LAT_OUT<1:0> may be set by a signal received from the external device.

The data output enable signal DOUT_EN is a signal indicating that the data output operation is being performed. The dummy read enable signal DUMMY_EN may be activated for a certain period of time before the data output operation starts.

The column address generation controller CNT_ADD 242 may generate a first bank address AX_B0<i:0> (i being a positive integer) and a second bank address AX_B1<i:0> (i being a positive integer), and supply the generated first and second bank addresses AX_B0<i:0> and AX_B1<i:0> to the page buffer 230. The page buffer 230 may output stored data in response to the first bank address AX_B0<i:0> and the second bank address AX_B1<i:0>. A value of each of the first bank address AX_B0<i:0> and the second bank address AX_B1<i:0> may be generated, increased or decreased in synchronization with the data output delay clock signal CKCOL_DOUT generated by the data output delay controller DOUT_LATENCY 2411. For example, the value of each of the first bank address AX_B0<i:0> and the second bank address AX_B1<i:0> may increase or decrease in synchronization with a rising edge of the data output delay clock signal CKCOL_DOUT.

The page buffer 230 may output the stored data to the pipe latch PIPE LATCH 2410 through a first and second bank global data lines GDL_B0<15:0> and GDL_B1<15:0> in response to first and second bank address AX_B0<i:0> and AX_B1<i:0>, respectively. Hence, the first bank global data line GDL_B0<15:0> may be loaded with data corresponding to the first bank address AX_B0<i:0>, and the second bank global data line GDL_B1<15:0> may be loaded with data corresponding to the second bank address AX_B1<i:0>.

The data output delay controller DOUT_LATENCY 2411 may generate a pipe input global data output signal PIN_GDL and output the generated pipe input global data output signal PIN_GDL to the pipe latch PIPE LATCH 2410. The pipe input global data output signal PIN_GDL may operate in synchronization with the data output delay clock signal CKCOL_DOUT, and play the role of controlling the data output delay in the data output operation together with the data output delay clock signal CKCOL_DOUT. The pipe input global data output signal PIN_GDL may include a pulse in synchronization with a falling edge of the data output delay clock signal CKCOL_DOUT during the data output operation.

The data output delay controller DOUT_LATENCY 2411 may generate a first and a second pipe select bank signals SEL_B0 and SEL_B1 and output the generated first and second pipe select bank signals SEL_B0 and SEL_B1 to the pipe latch PIPE LATCH 2410. The first and second pipe select bank signals SEL_B0 and SEL_B1 may each include a pulse in twice the cycle of the clocking cycle of the read enable clock signal RE_N during the data output operation. For example, if the first pipe select bank signal SEL_B0 generates a pulse in synchronization with an odd number clock of the read enable clock signal RE_N, the second pipe select bank signal SEL_B1 may generate a pulse in synchronization with an even number clock of the read enable clock signal RE_N.

The data output delay controller DOUT_LATENCY 2411 may generate a first and a second pipe output bank signals POUT_B0<3:0> and POUT_B1<3:0> and output the generated first and second pipe output bank signals POUT_B0<3:0> and POUT_B1<3:0> to the pipe latch PIPE LATCH 2410. The first and second pipe output bank signals POUT_B0<3:0> and POUT_B1<3:0> may each be changed in the rising edge at every two clockings of the read enable clock signal RE_N.

The pipe latch PIPE LATCH 2410 may receive first data is outputted from the page buffer 230 through the first bank global data line GDL_B0<15:0>. The first data may be inputted into the data output delay controller DOUT_LATENCY 2411 through a global data output bus GDL_OUT<15:0>, which is controlled by the pipe input global data output signal PIN_GDL, the first pipe output bank signal POUT_B0<3:0> and the first pipe select bank signal SEL_B0. Further, the pipe latch PIPE LATCH 2410 may receive second data is outputted from the page buffer 230 through the second bank global data line GDL_B1<15:0>. The second data may be inputted into the data output delay controller DOUT_LATENCY 2411 through the global data output bus GDL_OUT<15:0>, which is controlled by the pipe input global data output signal PIN_GDL, the second pipe output bank signal POUT_B1<3:0> and the second pipe select bank signal SEL_B1.

The data input into the data output delay controller DOUT_LATENCY 2411 through the global data output bus GDL_OUT<15:0> may be transmitted to the data output buffer OUTBUF 251 included in the I/O circuit 250 through a rising sync data output bus DOUT_R<7:0> and a falling sync data output bus DOUT_F<7:0>. The data output buffer OUTBUF 251 may output the data received through the rising sync data output bus DOUT_R<7:0> and the falling sync data output bus DOUT_F<7:0> to the external device through the data I/O pins DQ<7:0>. The data being loaded on the data I/O pins DQ<7:0> may be outputted in synchronization with the rising edge of each of the rising sync clock RCLK and the falling sync clock FCLK.

Figure 3:
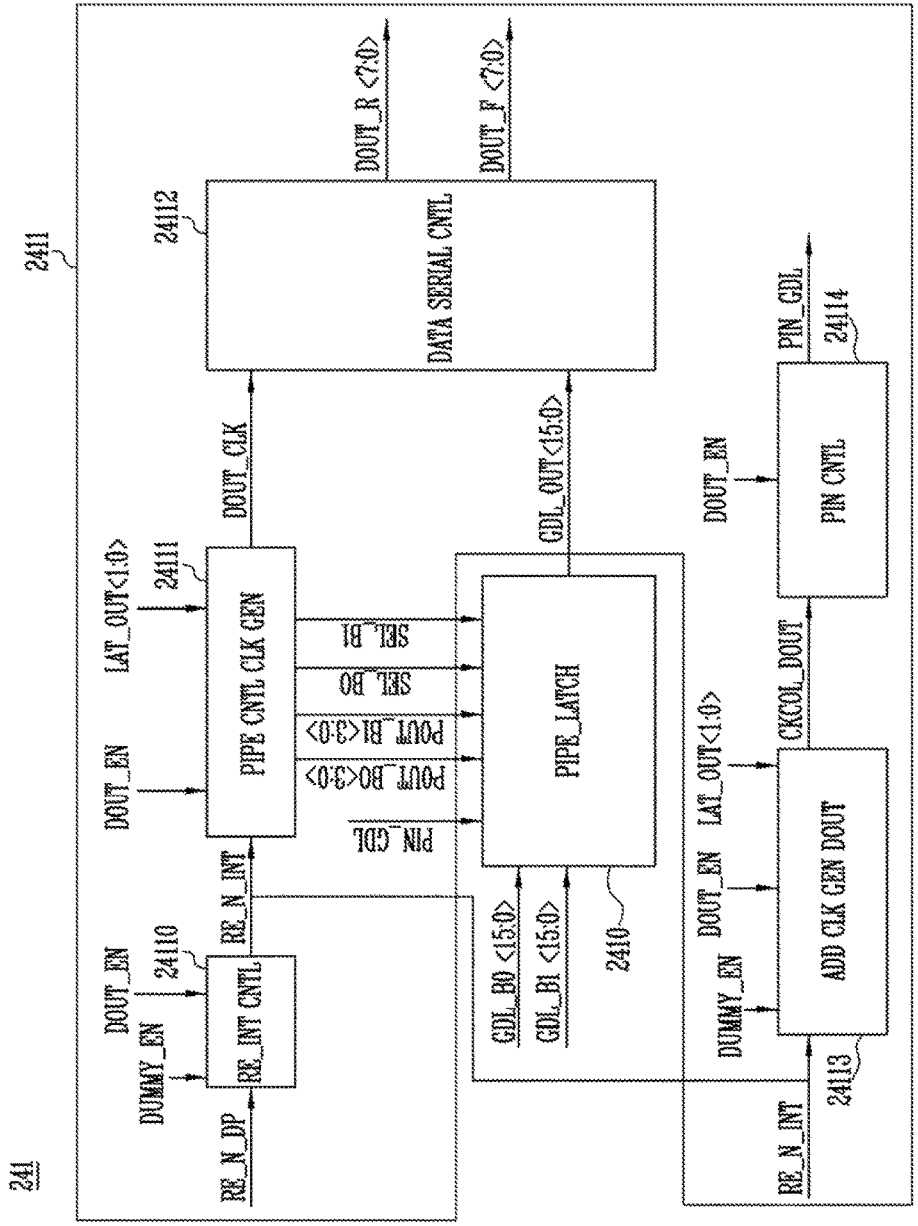
FIG. 3 is a diagram illustrating the data output controller of FIG. 2.

FIG. 3 is a diagram illustrating the data output controller 241 of FIG. 2.

Referring to FIG. 3, the data pass sync strobe clock signal RE_N_DP from the clock input buffer INBUF_RE 252 is inputted into an inner read enable signal controller RE_INT CNTL 24110. When the data output enable signal DOUT_EN is activated, the inner read enable signal controller RE_INT CNTL 24110 generates an inner read enable clock signal RE_N_INT in response to the dummy read enable signal DUMMY_EN and the data pass sync strobe clock signal RE_N_DP. The inner read enable clock signal RE_N_INT may include a plurality of pulses by the dummy read enable signal DUMMY_EN in a dummy read operation period. Further, in the data output operation period, the inner read enable clock signal RE_N_INT may perform clocking in synchronization with the data pass sync strobe clock signal RE_N_DP. When generating the data pass sync strobe clock signal RE_N_DP and the inner read enable clock signal RE_N_INT from the read enable clock signal RE_N, without being controlled by the data output delay signal LAT_OUT<1:0>, the data pass sync strobe clock signal RE_N_DP and the inner read enable clock signal RE_N_INT may be generated directly from the read enable clock signal RE_N, and thus there may be very little time delay between the read enable clock signal RE_N, the data pass sync strobe clock signal RE_N_DP and the inner read enable clock signal RE_N_INT. Consequently, the timing margin in the data output operation is improved, thereby enabling high speed data outputting operations.

The data output address clock generator ADD CLK GEN DOUT 24113 may generate a data output delay clock signal CKCOL_DOUT. The data output delay clock signal CKCOL_DOUT may include a plurality of pulses in a period where the dummy read enable signal DUMMY_EN is activated in the dummy read operating period. Further, in the data output operation period, the data output delay clock signal CKCOL_DOUT may perform clocking in synchronization with the inner read enable clock signal RE_N_INT, and the clocking cycle may be twice that of the inner read enable clock signal RE_N_INT. The time point of starting the clocking of the data output delay clock signal CKCOL_DOUT may change according to the data output delay signal LAT_OUT<1:0> during the data output operation.

The pipe input controller PIN CNTL 24114 may receive the data output delay clock signal CKCOL_DOUT and generate the pipe input global data output signal PIN_GDL. The pipe input global data output signal PIN_GDL may include a pulse in response to the falling edge of the data output delay clock signal CKCOL_DOUT.

The pipe control clock generator PIPE CNTL CLK GEN 24111 may generate a first and a second pipe output bank signals POUT_B0<3:0> and POUT_B1<3:0>, and a first and a second pipe select bank signals SEL_B0 and SEL_B1. An initial status of the first and second pipe select bank signals SEL_B0 and SEL_B1 may be changed by the data output delay signal LAT_OUT<1:0> at the starting time point of the data output operation. Further, an initial value of the first and second pipe output bank signals POUT_B0<3:

0> and POUT_B1<3:0> may be changed by the data output delay signal LAT_OUT<1:0> at the starting time point of the data output operation. The first pipe select bank signal SEL_B0 may include a pulse in synchronization with the odd number falling edge of the inner read enable clock signal RE_N_INT. The second pipe select bank signal SEL_B1 may include a pulse in synchronization with the even number falling edge of the inner read enable clock signal RE_N_INT. That is, each of the first and second pipe select bank signals SEL_B0 and SEL_B1 may include a pulse once in response to twice the clockings of the inner read enable clock signal RE_N_INT. The value of the first and second pipe output bank signals POUT_B0<3:0> and POUT_B1<3:0> may change in synchronization with the rising edge of the inner read enable clock signal RE_N_INT. Further, the value of the first and second pipe output bank signal POUT_B0<3:0> and POUT_B1<3:0> may change once when the inner read enable clock signal RE_N_INT performs clocking twice. That is, the changing cycle of the value of the first and second pipe output bank signals POUT_B0<3:0> and POUT_B1<3:0> may be twice the clocking cycle of the inner read enable clock signal RE_N_INT. Further, the pipe control clock generator PIPE CNTL CLK GEN 24111 may generate a data output clock signal DOUT_CLK based on the inner read enable clock signal RE_N_INT.

A data serial controller DATA SERIAL CNTL 24112 may synchronize the data received from the pipe latch PIPE LATCH 2410 through the global data output bus GDL_OUT<15:0> with the data output clock signal DOUT_CLK and load the synchronized data on the rising sync data output bus DOUT_R<7:0> and the falling sync data output bus DOUT_F<7:0>. The data loaded on the rising sync data output bus DOUT_R<7:0> may be in synchronization with the rising edge of the data output clock signal DOUT_CLK, and the data loaded on the falling sync data output bus DOUT_F<7:0> may be in synchronization with the falling edge of the data output clock signal DOUT_CLK.

FIG. 4 is a diagram illustrating a method for controlling a data output delay clock signal according to a set value of the data output delay signal. Referring to FIG. 4, operations of the data output delay clock signal CKCOL_DOUT may change according to a set value of the data output delay signal LAT_OUT<1:0>. In the case where the set value of the data output delay signal LAT_OUT<1:0> is '00', a first rising edge of the data output delay output signal CKCOL_DOUT may be generated in a second rising edge of the inner read enable clock signal RE_N_INT in the data output operation period. This may be the same when the set value of the data output delay signal LAT_OUT<1:0> is '01'. When the set value of the data output delay signal LAT_OUT<1:0> is '10', the first rising edge of the data output delay clock signal CKCOL_DOUT may be generated in a fourth rising edge of the inner read enable clock signal RE_N_INT in the data output operation period. Further, in the case where the set value of the data output delay signal LAT_OUT<1:0> is '11', the first rising edge of the data output delay clock signal CKCOL_DOUT may be generated in a sixth rising edge of the inner read enable clock signal RE_N_INT.

FIG. 5 is a diagram illustrating a method for controlling a first pipe output bank signal according to a set value of the data output delay signal.

Referring to FIG. 5, the initial value of the first pipe output bank signal POUT_B0<3:0> at the starting time point of the data output operation period may change according to the set value of the data output delay signal LAT_OUT<1:0>. In the case where the set value of the data output delay signal LAT_OUT<1:0> is '00', the initial value of the first pipe output bank signal POUT_B0<3:0> at the starting time point of the data output operation period may be '0001'. In the case where the set value of the data output delay signal LAT_OUT<1:0> is '01', the initial value of the first pipe output bank signal POUT_B0<3:0> at the starting time point of the data output operation period may be '1000'. Further, also in the case where the set value of the data output delay signal LAT_OUT<1:0> is '10', the initial value of the first pipe output bank signal POUT_B0<3:0> at the starting time point of the data output operation period may be '1000'. In the case where the set value of the data output delay signal LAT_OUT<1:0> is '11', the initial value of the first pipe output bank signal POUT_B0<3:0> at the starting time point of the data output operation period may be '0100'.

FIG. 6 is a diagram illustrating a method for controlling a second pipe output bank signal according to a set value of the data output delay signal.

Referring to FIG. 6, the initial value of the second pipe output bank signal POUT_B1<3:0> at the starting time point of the data output operation period may change according to the set value of the data output delay signal LAT_OUT<1:0>. When the set value of the data output delay signal LAT_OUT<1:0> is '00', the initial value of the second pipe output bank signal POUT_B1<3:0> at the starting time point of the data output operation period may be '0001'. When the set value of the data output delay signal LAT_OUT<1:0> is '01', the initial value of the second pipe output bank signal POUT_B1<3:0> at the starting time point of the data output operation period may be '1000'. Also when the set value of the data output delay signal LAT_OUT<1:0> is '10', the initial value of the second pipe output bank signal POUT_B1<3:0> at the starting time point of the data output operation period may be '1000'. When the set value of the data output delay signal LAT_OUT<1:0> is '11', the initial value of the second pipe output bank signal POUT_B1<3:0> at the starting time point of the data output operation period may be '0100'.

FIG. 7 is a diagram illustrating a method for controlling the first pipe select bank signal and the second pipe select bank signal according to the set value of the data output delay signal.

Referring to FIG. 7, the control method at the data output operation period of the first pipe select bank signal SEL_B0 and the second pipe select bank signal SEL_B1 may change according to the set value of the data output delay signal LAT_OUT<1:0>. When the set value of the data output delay signal LAT_OUT<1:0> is '00', '10' or '11', the first pipe select bank signal SEL_B0 activates first at the data output operation starting point, and the second pipe select bank signal SEL_B1 may activate thereafter. Further, when the set value of the data output delay signal LAT_OUT<1:0> is '01', the second pipe select bank signal SEL_B1 activates first at the data output operation starting point, and the first pipe select bank signal SEL_B0 may activate thereafter.

Figure 8:
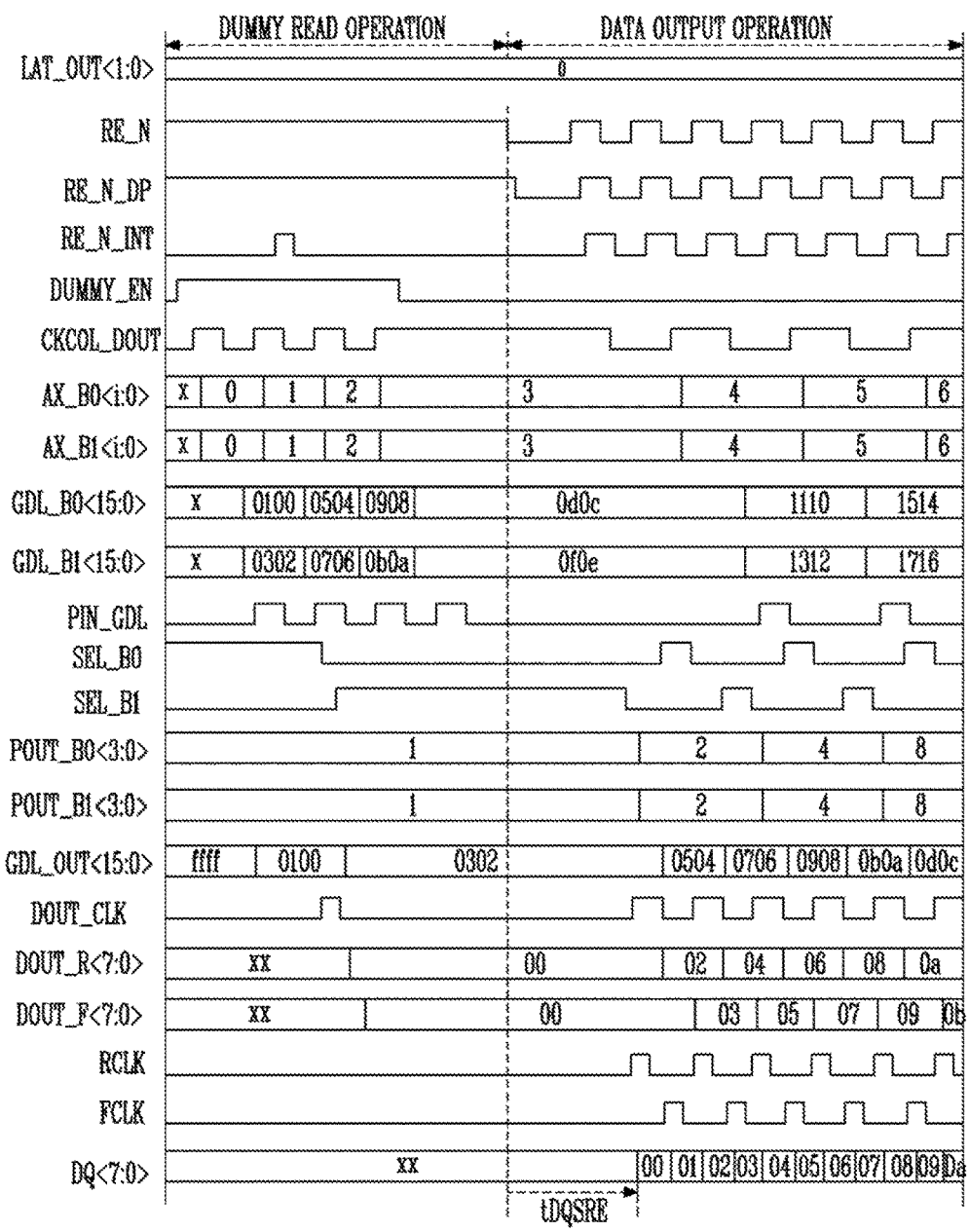
FIG. 8 is a diagram illustrating a data output timing in the case where a set value of a data output delay signal is '00' according to an embodiment of the present disclosure.

FIG. 8 is a diagram illustrating the data output timing when the set value of the data output delay signal is '00' according to an embodiment of the present disclosure.

Referring to FIG. 8, the data output operation is performed when the set value of the data output delay signal LAT_OUT<1:0> is '00', that is, '0'. During the dummy read operation period, the dummy read enable single DUMMY_EN activates, and the read enable clock RE_N being received from the external device maintains a certain level (for example, a high). During the period where the dummy read enable signal DUMMY_EN activates, the data output delay clock signal CKCOL_DOUT includes a plurality of pulses. For example, during the period where the dummy read enable signal DUMMY_EN activates, the data output delay clock signal CKCOL_DOUT may include four rising edges. The first and second bank address AX_B0<i:0> and AX_B1<i:0> may be synchronized to the rising edge of the data output delay clock signal CKCOL_DOUT and their values may change accordingly. Data output from the page buffer 230 corresponding to the first bank address AX_B0<i:0> may be synchronized to the rising edge of the data output delay clock signal CKCOL_DOUT, and then loaded on the first bank global data line GDL_B0<15:0>. Data output corresponding to the second bank address AX_B1<1:0> may be synchronized to the rising edge of the data output delay clock signal CKCOL_DOUT and then loaded on the second bank global data line GDL_B1<15:0>.

When the data output operation period starts where the data output enable signal DOUT_EN is activated, the read enable clock signal RE_N being supplied from the external device starts clocking, and the data pass sync strobe clock signal RE_N_DP and the inner read enable clock signal RE_N_INT are generated in synchronization with the rising edge of the read enable clock signal RE_N. Further, the data output delay clock signal CKCOL_DOUT may perform clocking in twice the cycle in synchronization with the rising edge of the enable clock signal RE_N_INT. In the case where the set value of the data output delay signal LAT_OUT<1:0> is '00', the first rising of the data output delay clock signal CKCOL_DOUT occurs in the second rising edge of the inner read enable clock signal RE_N_INT in the data output operation period as illustrated in FIG. 8. When generating the data pass sync strobe clock signal RE_N_DP and the inner read enable clock signal RE_N_INT from the read enable clock signal RE_N, without being controlled by the data output delay signal LAT_OUT<1:0>, the data pass sync strobe clock signal RE_N_DP and the inner read enable clock signal RE_N_INT may be generated directly from the read enable clock signal RE_N, and thus, there may be very little time delay between the read enable clock signal RE_N and the data pass sync strobe clock signal RE_N_DP and the inner read enable clock signal RE_N_INT. Consequently, the timing margin at the data output operation improves, enabling high speed data output operations.

The pipe input global data output signal PIN_GDL is inputted into the pipe latch PIPE LATCH 2410 and controls pipeline operations for high speed data transmission. The pipe input global data output signal PIN_GDL includes a pulse in synchronization with the falling edge of the data output delay clock signal CKCOL_DOUT. Further, the values of the first and the second pipe output bank signals POUT_B0<3:0> and POUT_B1<3:0> change in synchronization with the rising edge of the pipe input global data output signal PIN_GDL. In the case where the set value of the data output delay signal LAT_OUT<1:0> is '00', as illustrated in FIG. 8, the initial value of each of the first and the second pipe output bank signals POUT_B0<3:0> and the POUT_B1<3:0> at the starting time point of the data output operation period is set to '0001(1)'.

The first pipe select bank signal SEL_B0 and the second pipe select bank signal SEL_B1 perform clocking in twice the cycle in synchronization with the falling edge of the inner read enable clock signal RE_N_INT in the data output operation period. Further, when the set value of the data output delay signal LAT_OUT<1:0> is '00', the first pipe select bank signal SEL_B0 is selected first, and then the second pipe select bank signal SEL_B1 is selected. The inner read enable clock signal RE_N_INT is generated directly from the read enable clock signal RE_N without receiving a delay control by the data output delay signal LAT_OUT<1:0>, and thus there is very little time delay between the two signals. Since the first and second pipe select bank signal SEL_B0 and SEL_B1 are generated in synchronization with the falling edge of the inner read enable clock signal RE_N_INT, the first and second pipe select bank signals SEL_B0 and SEL_B1 do not receive a delay control by the data output delay signal LAT_OUT<1:0> either, and therefore the timing margin in the data output operation may improve. That is, the data loaded on the global data output bus GDL_OUT<15:0> may operate at a fast speed in synchronization with the first and second pipe select bank signals SEL_B0 and SEL_B1.

The data transmitted through the first bank global data line GDL_B0<15:0> and the second bank global data line GDL_B1<15:0> is loaded on the global data output bus GDL_OUT<15:0> in synchronization with the rising edge of the first pipe select bank signal SEL_B0 and the second pipe select bank signal SEL_B1, and is transmitted to the data output delay controller DOUT_LATENCY 2411.

The data output clock signal DOUT_CLK is generated from the inner read enable clock signal RE_N_INT. Since the inner read enable clock signal RE_N_INT is generated directly from the read enable clock signal RE_N without receiving a delay control by the data output delay signal LAT_OUT<1:0>, and also the data output clock signal DOUT_CLK is generated from the inner read enable clock signal RE_N_INT without receiving a delay control by the data output delay signal LAT_OUT<1:0>, it is possible to load data quickly on the rising sync data output bus DOUT_R<7:0> and the falling sync data output bus DOUT_F<7:0>.

Among the data transmitted to the data output delay controller DOUT_LATENCY 2411 through the global data output bus GDL_OUT<15:0>, the data corresponding to the first bank address AX_B0<i:0> is loaded on the rising sync data output bus DOUT_R<7:0> in synchronization with the rising edge of the data output clock signal DOUT_CLK, and then transmitted to the data output buffer OUTBUF 251. Among the data transmitted to the data output delay controller DOUT_LATENCY 2411 through the global data output bus GDL_OUT<15:0>, the data corresponding to the second bank address AX_B1<i:0> is loaded on the falling sync data output bus DOUT_F<7:0> in synchronization with the falling edge of the data output clock signal DOUT_CLK, and then transmitted to the data output buffer OUTBUF 251. Further, among the data stored in the pipe latch PIPE LATCH 2410 during the dummy read operation period, the initial 2 byte, that is, '00' and '01' may be extracted in advance and may be transmitted to the rising sync data output bus DOUT_R<7:0> and the falling sync data output bus DOUT_F<7:0>, respectively. By doing this, it is possible to secure a sufficient timing margin during the data output operation.

The rising sync clock RCLK performs clocking In synchronization with the rising edge of the read enable clock signal RE_N, and the falling sync clock FCLK performs clocking in synchronization with the falling edge of the read enable clock signal RE_N. The data loaded on the rising sync data output bus DOUT_R<7:0> and transmitted to the data output buffer OUTBUF 251 is transmitted to the external device through the data I/O pin <7:0> (i.e., DQ<7:0>) in synchronization with the rising sync clock RCLK. The data loaded on the falling sync data output bus DOUT_F<7:0> and transmitted to the data output buffer OUTBUF 251 is transmitted to the external device through the data I/O pin <7:0> (i.e., DQ<7:0>) in synchronization with the falling sync clock FCLK.

As the data pass sync strobe clock signal RE_N_DP and the inner read enable clock signal RE_N_INT are generated directly from the read enable clock signal RE_N without receiving a delay control by the data output delay signal LAT_OUT<1:0>, and the first pipe select bank signal SEL_B0, the second pipe select bank signal SEL_B1 and the data output clock signal DOUT_CLK are generated directly from the inner read enable clock signal RE_N_INT without receiving a delay control by the data output delay signal LAT_OUT<1:0>, the time tDQSRE it takes for the first data to be transmitted to the external device through the data I/O pin <7:0> (i.e., DQ<7:0>) by a clocking operation of the read enable clock signal RE_N may be reduced, thereby enabling a higher speed operation.

Figure 9:
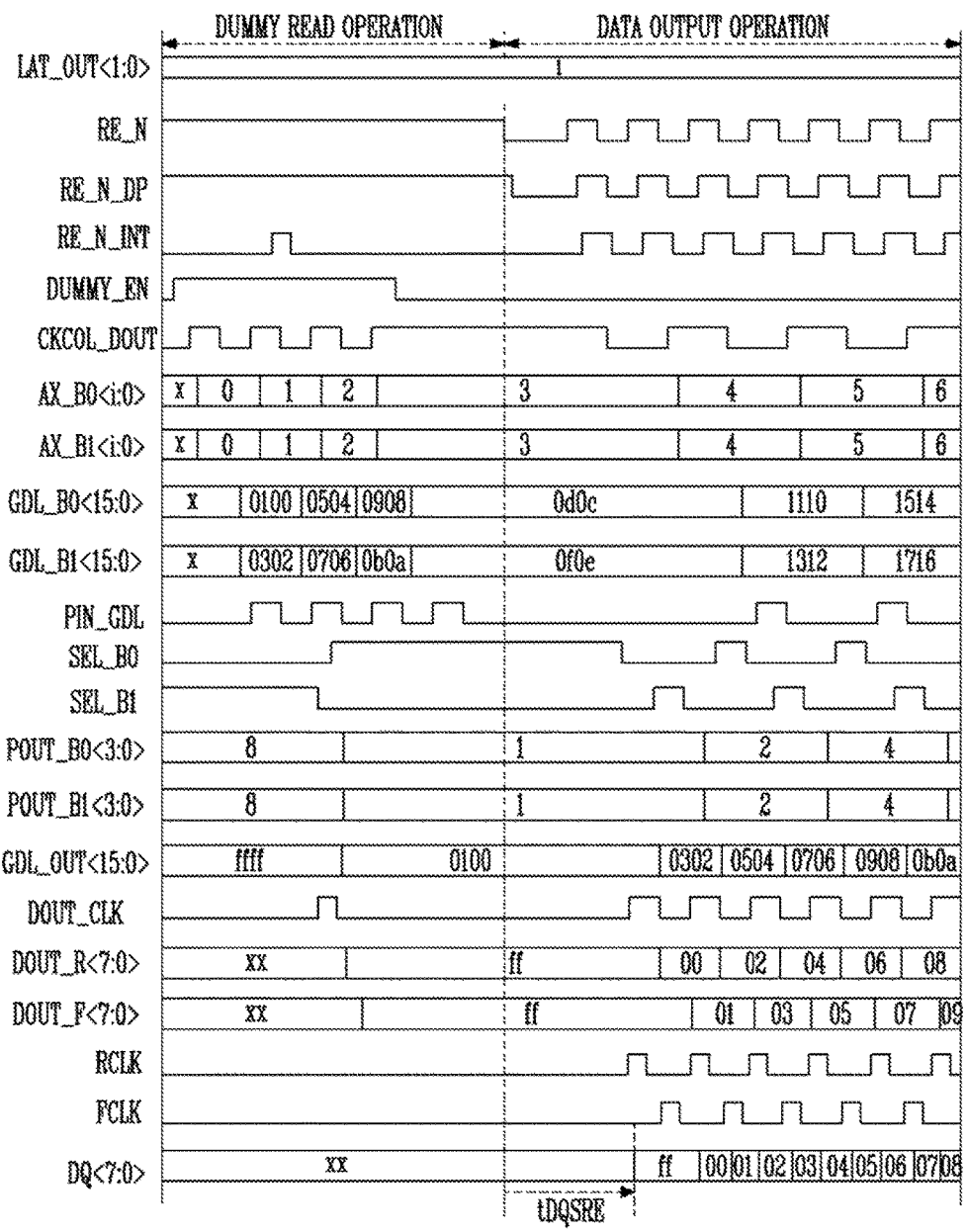
FIG. 9 is a diagram illustrating a data output timing in the case where a set value of a data output delay signal is '01' according to an embodiment of the present disclosure.

FIG. 9 is a diagram illustrating the data output timing when the set value of the data output delay signal is '01' according to an embodiment of the present disclosure.

Referring to FIG. 9, in the case where the set value of the data output delay signal LAT_OUT<1:0> is '01', that is, '1', in the data output operation period, the first rising of the data output delay clock signal CKCOL_DOUT is generated in synchronization with the second rising edge of the inner read enable clock signal RE_N_INT just as the case where the set value of the data output delay signal LAT_OUT<1:0> is '00'.

In the case where the set value of the data output delay signal LAT_OUT<1:0> is '01', that is, '1', the initial value of the first pipe output bank signal POUT_B0<3:0> and the second pipe output bank signal POUT_B1<3:0> are set to '1000' unlike the case where the set value of the data output delay signal LAT_OUT<1:0> is '00'. Further, among the first pipe select bank signal SEL_B0 and the second pipe select bank signal SEL_B1, the second pipe select bank signal SEL_B1 is set to be selected first. In this case, during the first high pulse period of the read enable clock signal RE_N, the value of the second pipe output bank signal POUT_B1<3:0> is '8', that is, the data transmitted by the second pipe select bank signal SEL_B1 of the second pipe output bank signal <3> (i.e., POUT_B1<3>) is outputted, and thus dummy data of 2 byte is transmitted through the data output bus GDL_OUT<15:0>. During the second high pulse period of the read enable clock signal RE_N, the value of the first pipe output bank signal POUT_B0<3:0> is '1', that is, the data transmitted by the first pipe select bank signal SEL_B0 of the first pipe output bank signal <0> (i.e., POUT_B0<0>) is outputted, and thus wanted data is outputted through the global data output bus GDL_OUT<15:0>.

By such changed settings, at the final data outputting, dummy data of 2 byte is outputted from the first clock of the read enable clock signal RE_N, and wanted data is outputted to the external device through the data I/O pin <7:0> (i.e., DQ<7:0>) starting from the second clock.

Figure 10:
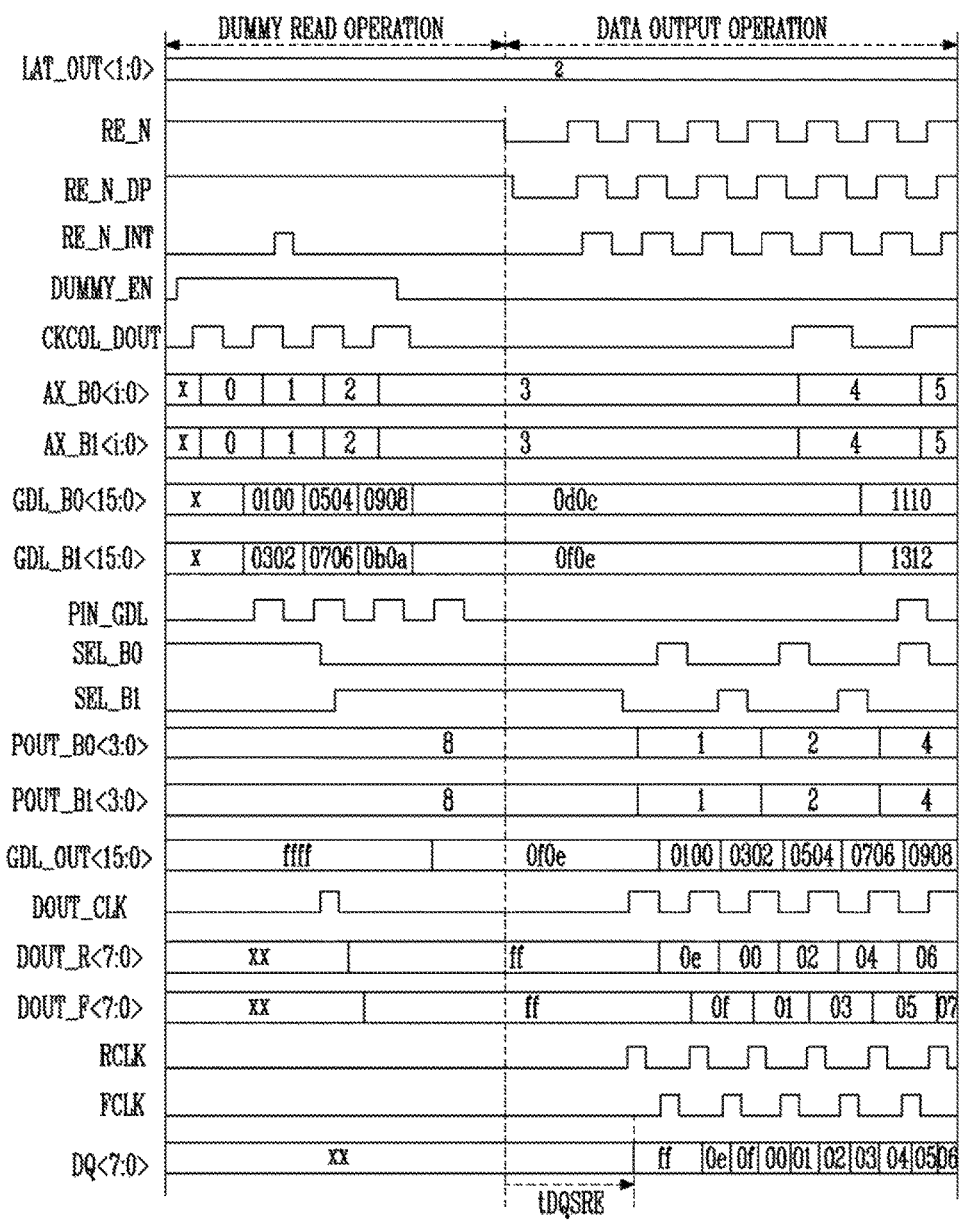
FIG. 10 is a diagram illustrating a data output timing in the case where a set value of a data output delay signal is '10' according to an embodiment of the present disclosure.

FIG. 10 is a diagram illustrating the data output timing in the case where the set value of the data output delay signal is '10' according to an embodiment of the present disclosure.

Referring to FIG. 10, in the case where the set value of the data output delay signal LAT_OUT<1:0> is '10', that is, '2', in the data output operation period, the first rising of the data output delay clock signal CKCOL_DOUT is generated in the fourth rising edge of the inner read enable clock signal RE_N_INT unlike in the case where the set value of the data output delay signal LAT_OUT<1:0> is '00' and '01' as shown in FIGS. 8 and 9.

In the case where the set value of the data output delay signal LAT_OUT<1:0> is '10', that is, '2', the initial value of the first pipe output bank signal POUT_B0<3:0> and the second pipe output bank signal POUT_B1<3:0> at the starting time point of the data output operation period is set to '1000', that is, '8', as in the case where the set value of the data output delay signal LAT_OUT<1:0> is '01'. Further, among the first pipe select bank signal SEL_B0 and the second pipe select bank signal SEL_B1, the first pipe select bank signal SEL_B0 is selected first. In this case, during the first high pulse period of the read enable clock signal RE_N, the data transmitted by the first pipe select bank signal SEL_B0 of which the value of the first pipe output bank signal POUT_B0<3:0> is '8' that is, the first pipe output bank signal <3> (i.e., POUT_B0<3>), is outputted, and thus dummy data of 2 byte is outputted through the global data output bus GDL_OUT<15:0>. Further, during the second high pulse period of the read enable clock signal RE_N, the data transmitted by the second pipe select bank signal SEL_B1 of which the value of the second pipe output bank signal POUT_B1<3:0> is '8', that is, the second pipe output bank signal <3> (i.e., POUT_B1<3>), is outputted, and thus another dummy data of 2 byte is outputted through the global data output bus GDL_OUT<15:0>. During the third high pulse period of the read enable clock signal RE_N, the data transmitted by the first pipe select bank signal SEL_B0 of which the value of the first pipe output bank signal POUT_B0<3:0> is '1', that is, the first pipe output bank signal <0> (i.e., POUT_B0<0>), is outputted, and thus wanted data is outputted through the global data output buts GDL_OUT<15:0>.

By such changed settings, at the final data outputting, dummy data of 4 byte is outputted from the first and second clock of the read enable clock signal RE_N, and wanted data is outputted from the third clock to the external device through the data I/O pin <7:0> (i.e., DQ<7:0>).

Figure 11:
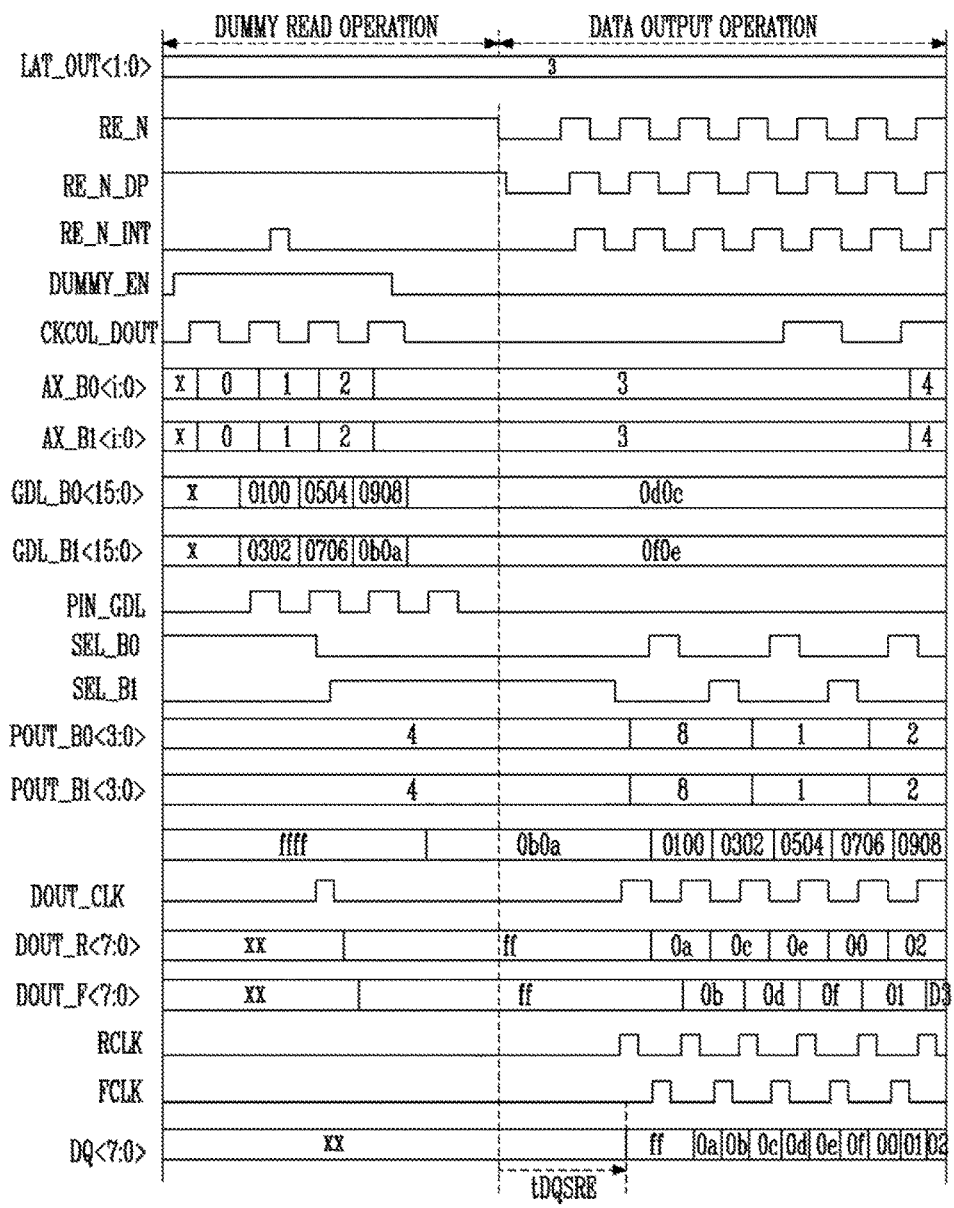
FIG. 11 is a diagram illustrating a data output timing in the case where a set value of a data output delay signal is '11' according to an embodiment of the present disclosure.

FIG. 11 is a diagram illustrating the data output timing in the case where the set value of the data output delay signal is '11' according to an embodiment of the present disclosure.

Referring to FIG. 11, in the case where the set value of the data output delay signal LAT_OUT<1:0> is '11', that is, '3', in the data output operation period, the first rising of the data output delay clock signal CKCOL_DOUT is generated in the sixth rising edge of the inner read enable clock signal RE_N_INT.

In the case where the set value of the data output delay signal LAT_OUT<1:0> is '11', that is, '3', the initial value of the first pipe output bank signal POUT_B0<3:0> and the second pipe output bank signal POUT_B1<3:0> at the starting time point of the data output operation period is set to '0100', that is, '4'. Further, among the first pipe select bank signal SEL_B0 and the second pipe select bank signal SEL_B1, the first pipe select bank signal SEL_B0 is set to be selected first. In this case, during the first high pulse period of the read enable clock signal RE_N, the data transmitted by the first pipe select bank signal SEL_B0 of which the value of the first pipe output bank signal POUT_B0<3:0> is '4', that is, the first pipe output bank signal <2> (i.e., POUT_B0<2>), is outputted, and thus dummy data of 2 byte is outputted to the global data output bus GDL_OUT<15:0>. Further, during the second high pulse period of the read enable clock signal RE_N, the data transmitted by the second pipe select bank signal SEL_B1 of which the value of the second pipe output bank signal POUT_B1<3:0> is '4', that is, the second pipe output bank signal <2> (i.e., POUT_B1<2>), is outputted, and thus another dummy data of 2 byte is outputted through the global data output bus GDL_OUT<15:0>. During the third high pulse period of the read enable clock signal RE_N, the data transmitted by the first pipe select bank signal SEL_B0 of which the value of the first pipe output bank signal POUT_B0<3:0> is '8', that is, the first pipe output bank signal <3> (i.e., POUT_B0<3>), is outputted, and thus another dummy data of 2 byte is outputted through the global data output bus GDL_OUT<15:0>. During the fourth high pulse period of the read enable clock signal RE_N, the data transmitted by the second pipe select bank signal SEL_B1 of which the value of the second pipe output bank signal POUT_B8<3:0> is '8', that is, the second pipe select bank signal <3> (i.e., POUT_B1<3>), is outputted, and thus another dummy data of 2 byte is outputted through the global data output bus GDL_OUT<15:0>. During the fifth high pulse period of the read enable clock signal RE_N, the data transmitted by the first pipe select bank signal SEL_B0 of which the value of the first pipe output bank signal POUT_B0<3:0> is '1', that is, the first pipe output bank signal <0> (i.e., POUT_B0<0>), is outputted, and thus wanted data is outputted through the global data output bus GDL_OUT<15:0>.

By such changed settings, at the final data outputting, dummy data of 8 byte is outputted from the first to fourth clock of the read enable clock signal RE_N, and wanted data is outputted from the fifth clock to the external device through the data I/O pin <7:0> (i.e., DQ<7:0>).

Figure 12:
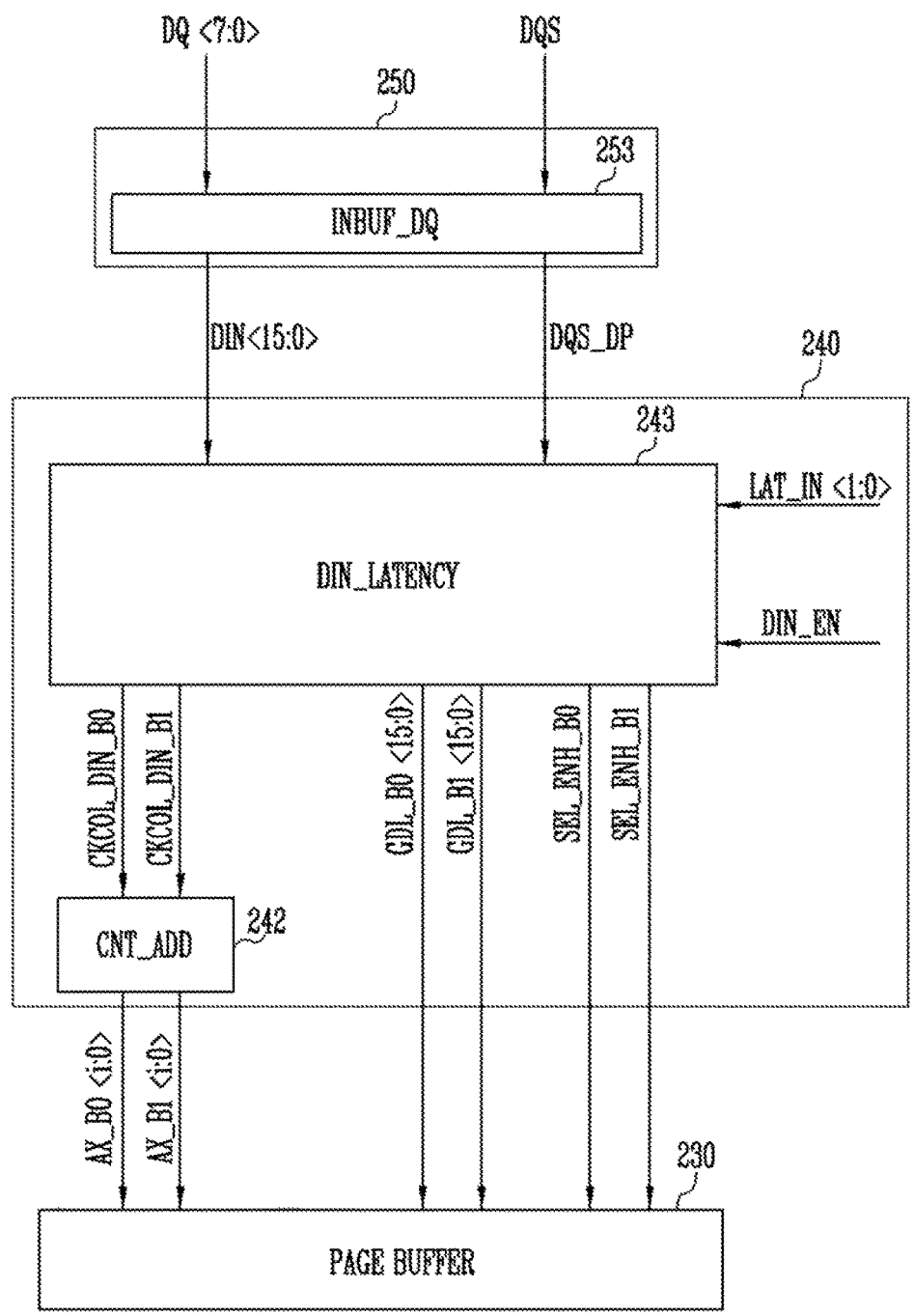
FIG. 12 is a diagram illustrating the peripheral circuit of FIG. 2 according to another embodiment of the present disclosure.

FIG. 12 is a diagram illustrating the peripheral circuit of FIG. 2 according to another embodiment of the present disclosure.

Referring to FIG. 12, the I/O circuit 250 may include a data input buffer INBUF_DQ 253. The data input buffer INBUF_DQ 253 may receive the data strobe clock signal DQS from the external device. Further, the data input buffer INBUF_DQ 253 may receive data input through the data I/O pins DQ<7:0> in synchronization with the data strobe clock signal DQS. Further, the data input buffer INBUF_DQ 253 may perform a buffering on the data strobe clock signal DQS and generate the data pass sync strobe clock signal DQS_DP. The data pass sync strobe clock signal DQS_DP may be the data strobe clock signal DQS delayed in the data input operation period. When generating the data pass sync strobe clock signal DQS_DP from the data strobe clock signal DQS, there is no control by the data input delay signal LAT_IN<1:0>, and the data pass sync strobe clock signal DQS_DP is generated directly from the data strobe clock signal DQS, and thus there may be very little time delay between the two signals. Consequently, the timing margin improves in the data input operation, enabling high speed data input operations.

The data input buffer INBUF_DQ 253 may load the data input through the data I/O pins DQ<7:0> on the input bus DIN<15:0>. The data transmission frequency through the data input bus DIN<15:0> may be a half of the data transmission frequency through the data I/O pin <7:0> (i.e., DQ<7:0>). Consequently, a more stable data transmission is possible.

The column decoder 240 may include a data input delay controller DIN_LATENCY 243 and a column address generation controller CNT_ADD 242.

The data input delay controller DIN_LATENCY 243 may generate a first bank data input delay clock signal CKCOL_DIN_B0 and a second bank data input delay clock signal CKCOL_DIN_B0 in response to the data pass sync strobe clock signal DQS_DP and the data input delay signal LAT_IN<1:0>. The first bank data input delay clock signal CKCOL_DIN_B0 may include a pulse once in every two clockings in the falling edge of the data pass sync strobe clock signal DQS_DP in the period where the data input enable signal DIN_EN is activated. The second bank data input delay clock signal CKCOL_DIN_B1 may include a pulse once in every two clockings in the falling edge of the data pass sync strobe clock signal DQS_DP in the period where the data input enable signal DIN_EN is activated. For example, the first bank data input delay clock signal CKCOL_DIN_B0 may include the pulse in the odd number falling edge of the data pass sync strobe clock signal DQS_DP, and the second bank data input delay clock signal CKCOL_DIN_B1 may include the pulse in the even number falling edge of the data pass sync strobe clock signal DQS_DP, and vice versa. Further, in the data input operation period, the first pulse generation time point of the first bank data input delay clock signal CKCOL_DIN_B0 and the second bank data input delay clock signal CKCOL_DIN_B1 may be changed by the data input delay signal LAT_IN<1:0>. The data input delay signal LAT_IN<1:0> may be set by the signal received from the external device.

The data input delay controller DIN_LATENCY 243 may generate the first bank data input select signal SEL_ENH_B0 and the second bank data input select signal SEL_ENH_B1. The first bank data input select signal SEL_ENH_B0 may include a pulse once in every two clockings in the falling edge of the data pass sync strobe clock signal DQS_DP in the period where the data input enable signal DIN_EN is activated. The second bank data input select signal SEL_ENH_B1 may include a pulse once by intervals of twice of clockings in the falling edge of the data pass sync strobe clock signal DQS_DP in the period where the data input enable signal DIN_EN is activated. For example, the first bank data input select signal SEL_ENH_B0 may include the pulse in the odd number falling edge of the data pass sync strobe clock signal DQS_DP, and the second bank data input select signal SEL_ENH_B1 may include the pulse in the even number falling edge of the data pass sync strobe clock signal DQS_DP, and vice versa. Further, in the data input operation period, the first pulse generation time point of the first bank data input select signal SEL_ENH_B0 and the second bank data input select signal SEL_ENH_B1 may be changed by the data input delay signal LAT_IN<1:0>.

The data input delay controller DIN_LATENCY 243 may transmit the data from the data input buffer INBUF_DQ 253 through the data input bus DIN<15:0> to the page buffer 230 through the first bank global data line GDL_B0<15:0> and the second bank global data line GDL_B1<15:0>. The data transmission frequency of each of the first bank global data line GDL_B0<15:0> and the second bank global data line GDL_B1<15:0> may be a half of the data transmission frequency of the data input bus DIN<15:0>. Consequently, a more stable data transmission may be possible.

The column address generation controller CNT_ADD 242 may receive the first bank data input delay clock signal CKCOL_DIN_B0 and the second bank data input delay clock signal CKCOL_DIN_B1 from the data input delay controller DIN_LATENCY 243, generate a first bank address AX_B0<i:0> and a second bank address AX_B1<i:0> that increase or decrease sequentially, and supply the same to the page buffer 230. The page buffer 230 may store the data received through the first bank global data line GDL_B0<15:0> and the second bank global data line GDL_B1<15:0> in the page buffer 231 corresponding to the first bank address AX_B0<i:0> and the second bank address AX_B1<1:0>. The first bank address AX_B0<i:0> may increase or decrease sequentially in synchronization with the first bank data input delay clock signal CKCOL_DIN_B0. For example, the first bank address AX_B0<i:0> may change in synchronization with the rising edge of the first bank data input delay clock signal CKCOL_DIN_B0. The second bank address AX_B1<i:0> may increase or decrease sequentially in synchronization with the second bank data input delay clock signal CKCOL_DIN_B1. For example, the second bank address AX_B1<:0> may change in synchronization with the rising edge of the second bank data input delay clock signal CKCOL_DIN_B1.

Figure 13:
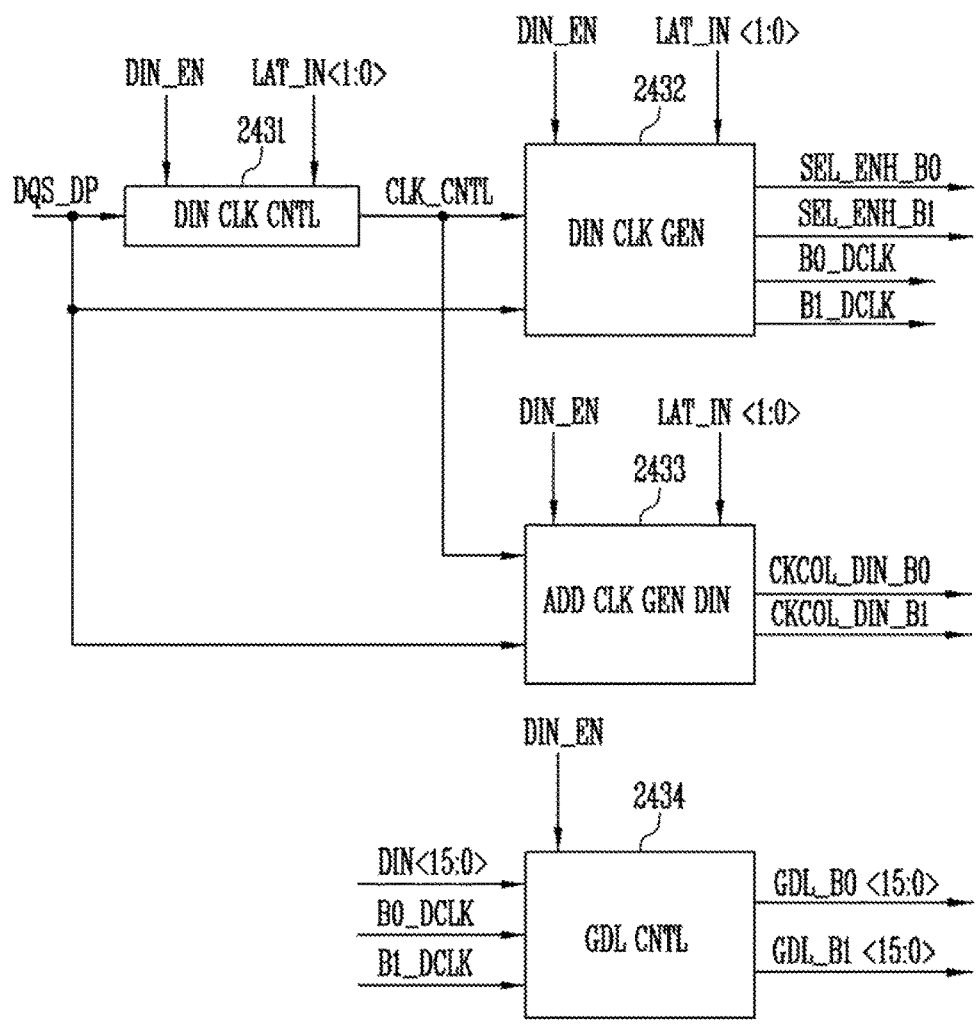
FIG. 13 is a diagram illustrating the data input delay controller of FIG. 12.

FIG. 13 is a diagram illustrating the data input delay controller of FIG. 12.

Referring to FIG. 13, the data input delay controller DIN_LATENCY 243 may include a data input clock controller DIN CLK CNTL 2431. The data input clock controller DIN CLK CNTL 2431 may generate a control clock signal CLK_CNTL. The control clock signal CLK_CNTL may perform clocking in synchronization with the rising edge of the data pass sync strobe clock signal DQS_DP during the period the data input enable signal DIN_EN is activated, and the clocking cycle may be twice that of the data pass sync strobe clock signal DQS_DP. Further, the initial status of the control clock signal CLK_CNTL may be changed at the data input operation starting time point according to the data input delay signal LAT_IN<1:0>.

The data input delay controller DIN_LATENCY 243 may include a data input clock generator DIN CLK GEN 2432. The data input clock generator DIN CLK GEN 2432 may generate the first bank data input select signal SEL_ENH_B0, the second bank data input select signal SEL_ENH_B1, the first bank clock B0_DCLK and the second bank clock B1_DCLK. The first bank clock B0_DCLK may include a pulse in synchronization with the falling edge of the data pass sync strobe clock signal DQS_DP, the pulse being generated once at every two clockings of the data pass sync strobe clock signal DQS_DP. The second bank clock B1_DCLK may include a pulse in synchronization with the falling edge of the data pass sync strobe clock signal DQS_DP, the pulse being generated once at every two clockings of the data pass sync strobe clock signal DQS_DP. The first bank clock B0_DCLK may include a pulse in synchronization with the odd number falling edge of the data input operation period of the data pass sync strobe clock signal DQS_DP, and the second bank clock B1_DCLK may include a pulse in synchronization with the even number falling edge of the data input operation period of the data pass sync strobe clock signal DQS_DP, and vice versa.

The first bank data input select signal SEL_ENH_B0 may include a pulse in synchronization with the falling edge of the data pass sync strobe clock signal DQS_DP, the pulse being generated once at every two clockings of the data pass sync strobe clock signal DQS_DP. The second bank data input select signal SEL_ENH_B1 may include a pulse in synchronization with the falling edge of the data pass sync strobe clock signal DQS_DP, the pulse being generated once at every two clockings of the data pass sync strobe clock signal DQS_DP. The first bank data input select signal SEL_ENH_B0 may include a pulse in synchronization with the odd number falling edge of the data input operation period of the data pass sync strobe clock signal DQS_DP, and the second bank data input select signal SEL_ENH_B1 may include a pulse in synchronization with the even number falling edge of the data input operation period of the data pass sync strobe clock signal DQS_DP, and vice versa.

The clocking starting time point of the first bank data input select signal SEL_ENH_B0 and the second bank data input select signal SEL_ENH_B1 of the data input operation period may change according to the data input delay signal LAT_IN<1:0>.

Further, the data input delay controller DIN_LATENCY 243 may include a data input address clock generator ADD CLK GEN DIN 2433. The data input address clock generator ADD CLK GEN DIN 2433 may generate the first bank data input delay clock signal CKCOL_DIN_B0 and the second bank data input delay clock signal CKCOL_DIN_B1.

The first bank data input delay clock signal CKCOL_DIN_B0 may include a pulse in synchronization with the falling edge of the data pass sync strobe clock signal DQS_DP, the pulse being generated once at every twice of clocking of the data pass sync strobe clock signal DQS_DP. The second bank data input delay clock signal CKCOL_DIN_B1 may include a pulse in synchronization with the falling edge of the data pass sync strobe clock signal DQS_DP, the pulse being generated once at every twice of clockings of the data pass sync strobe clock signal DQS_DP. The first bank data input delay clock signal CKCOL_DIN_B0 may include a pulse in synchronization with the odd number falling edge of the data input operation period of the data pass sync strobe clock signal DQS_DP, and the second bank data input delay clock signal CKCOL_DIN_B1 may include a pulse in synchronization with the even number falling edge of the data input operation period of the data pass sync strobe clock signal DQS_DP, and vice versa.

The starting time point of the clocking of the first bank data input delay clock signal CKCOL_DIN_B0 and the second bank data input delay clock signal CKCOL_DIN_B1 during the data input operation period may change according to the data input delay signal LAT_IN<1:0>.

The data input delay controller DIN_LATENCY 243 may include a global data line controller GDL CNTL 2434. The global data line controller GDL CNTL 2434 may transmit the data from the data input buffer INBUF_DQ 253 through the data input bus DIN<15:0> to the page buffer 230 through the first bank global data line GDL_B0<15:0> and the second bank global data line GDL_B1<15:0>.

The data through the first bank global data line GDL_B0<15:0> may be transmitted in synchronization with the rising edge of the first bank clock B0_DCLK. Further, the data through the second bank global data line GDL_B1<15:0> may be transmitted in synchronization with the rising edge of the second bank clock B1_DCLK. The data transmission frequency through the data input bus DIN<15:0> may be twice the data transmission frequency through the first bank global data line GDL_B0<15:0> and the second bank global data line GDL_B1<15:0>.

FIG. 14 is a diagram illustrating the method for controlling the control clock signal according to the set value of the data input delay signal.

Referring to FIG. 14, the initial status of the control clock signal CLK_CNTL at the starting time point of the data input operation may change according to the set value of the data input delay signal LAT_IN<1:0>. In the case where the set value of the data input delay signal LAT_IN<1:0> is '00', '10' or '11', the initial status of the control clock signal CLK_CNTL at the data input operation starting time point may be high. Further, in the case where the set value of the data input delay signal LAT_IN<1:0> is '01', the initial status of the control clock signal CLK_CNTL at the starting time point of the data input operation may be low.

FIG. 15 is a diagram illustrating the method for controlling the first bank data input select signal and the first bank data input delay clock signal according to the set value of the data input delay signal.

Referring to FIG. 15, operations of the first bank data input select signal SEL_ENH_B0, the second bank data input select signal SEL_ENH_B1, the first bank data input delay clock signal CKCOL_DIN_B0 and the second bank data input delay clock signal CKCOL_DIN_B1 may change according to the set value of the data input delay signal LAT_IN<1:0> during the data input operation. In the case where the set value of the data input delay signal LAT_IN<1:0> is '00', during the data input operation, the first bank data input select signal SEL_ENH_B0 and the first bank data input delay clock signal CKCOL_DIN_B0 may include the first pulse in the second falling edge of the data pass sync strobe clock signal DQS_DP. Here, although not shown, the second bank data input select signal SEL_ENH_B1 and the second bank data input delay clock signal CKCOL_DIN_B1 may include the first pulse after performing clocking to the first bank data input select signal SEL_ENH_B0 and the first bank data input delay clock signal CKCOL_DIN_B0 once, that is, in the third falling edge.

In the case where the set value of the data input delay signal LAT_IN<1:0> is '01', during the data input operation, the first bank data input select signal SEL_ENH_B0 and the first bank data input delay clock signal CKCOL_DIN_B0 may include the first pulse in the third falling edge of the data pass sync strobe clock signal DQS_DP. Here, although not shown, the second bank data input select signal SEL_ENH_B1 and the second bank data input delay clock signal CKCOL_DIN_B1 may include the first pulse after performing clocking to the first bank data input select signal SEL_ENH_B0 and the first bank data input delay clock signal CKCOL_DIN_B0 once, that is, in the fourth falling edge.

In the case where the set value of the data input delay signal LAT_IN<1:0> is '10', during the data input operation, the first bank data input select signal SEL_ENH_B0 and the first bank data input delay clock signal CKCOL_DIN_B0 may include the first pulse in the fourth falling edge of the data pass sync strobe clock signal DQS_DP. Here, although not shown, the second bank data input select signal SEL_ENH_B1 and the second bank data input delay clock signal CKCOL_DIN_B1 may include the first pulse after performing clocking to the first bank data input select signal SEL_ENH_B0 and the first bank data input delay clock signal CKCOL_DIN_B0 once, that is, in the fifth falling edge.

Further, in the case where the set value of the data input delay signal LAT_IN<1:0> is '11', during the data input operation, the first bank data input select signal SEL_ENH_B0 and the first bank data input delay clock signal CKCOL_DIN_B0 may include the first pulse in the sixth falling edge of the data pass sync strobe clock signal DQS_DP. Here, although not shown, the second bank data input select signal SEL_ENH_B1 and the second bank data input delay clock signal CKCOL_DIN_B1 may include the first pulse after performing clocking to the first bank data input select signal SEL_ENH_B0 and the first bank data input delay clock signal CKCOL_DIN_B0 once, that is, in the seventh falling edge.

Figure 16:
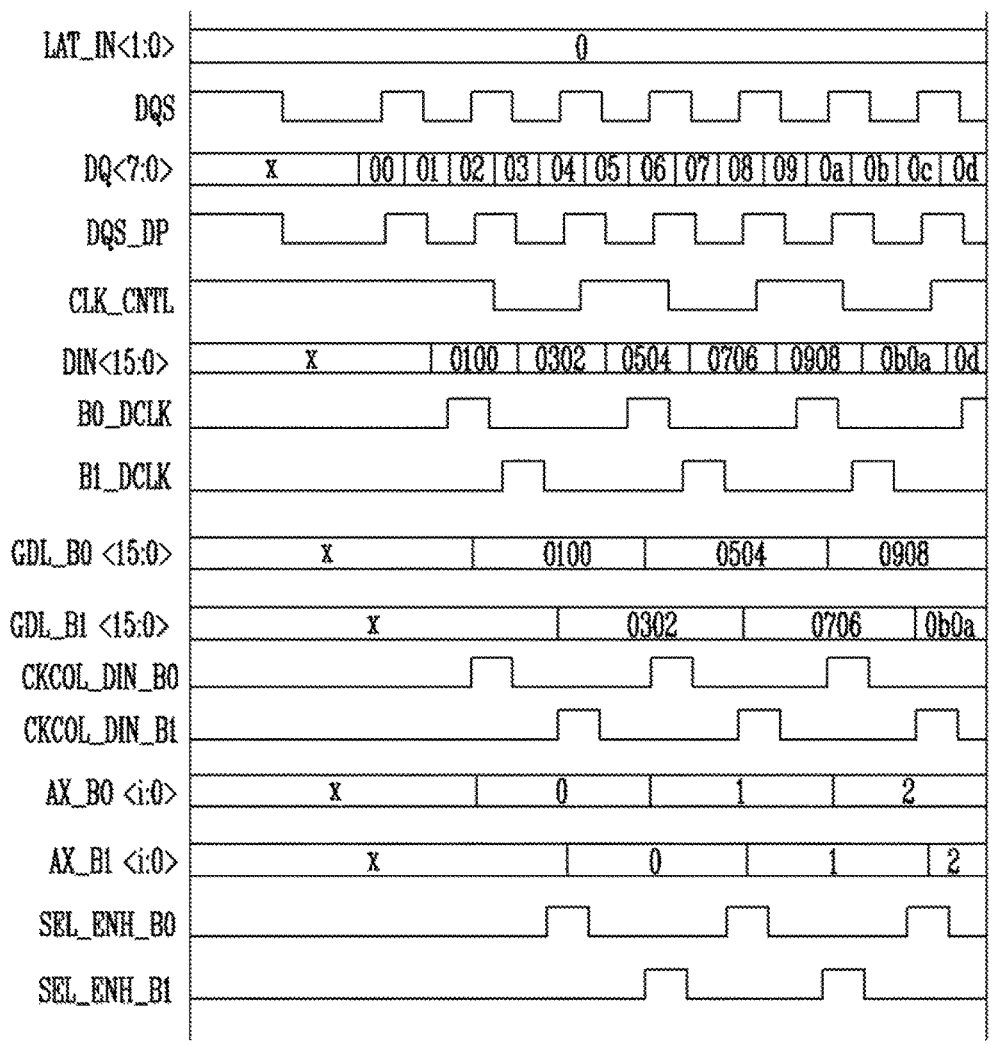
FIG. 16 is a diagram illustrating a data input timing in the case where a set value of a data input delay signal is '00' according to another embodiment of the present disclosure.

FIG. 16 is a diagram illustrating the data input timing in the case where the set value of the data input delay signal is '00' according to another embodiment of the present disclosure.

Referring to FIG. 16, data is input from the external device through the data I/O pins DQ<7:0> in synchronization with the data strobe clock signal DQS.

The data input buffer INBUF_DQ 253 receives the data strobe clock signal DQS from the external device, and generates and outputs the data pass sync strobe clock signal DQS_DP. Here, when generating the data pass sync strobe clock signal DQS_DP from the strobe clock signal DQS, without being controlled by the data input delay signal LAT_IN<1:0>, the data pass sync strobe clock signal DQS_DP is generated directly from the data strobe clock signal DQS, and thus there may be very little time delay between the two signals. Consequently, in the data input operation, the timing margin may improve, enabling high speed data input operation.

The control clock signal CLK_CNTL performs clocking in synchronization with the rising edge of the data pass sync strobe clock signal DQS_DP, and the control clock signal CLK_CNTL has twice the clocking cycle of the data pass sync strobe clock signal DQS_DP. In the case where the data input delay signal LAT_IN<1:0> is set to '00', the initial status of the control clock signal CLK_CNTL is set high in the data input operation.

The data input through the data I/O pins DQ<7:0> is loaded on the data input bus DIN<15:0> in synchronization with the data pass sync strobe clock signal DQS_DP, and changes in synchronization with the falling edge of the data pass sync strobe clock signal DQS_DP.

The first bank clock B0_DCLK and the second bank clock B1_DCLK include a pulse in synchronization with the falling edge of the data pass sync strobe clock signal DQS_DP, the first bank clock B0_DCLK and the second bank clock B1_DCLK having twice the clocking cycle of the data pass sync strobe clock signal DQS_DP.

Among the data loaded on the data input bus DIN<15:0>, the data corresponding to the first bank address AX_B0<i:0> is loaded on the first bank global data line GDL_B0<15:0> in synchronization with the rising edge of the first bank clock B0_DCLK. Among the data loaded on the data input bus DIN<15:0>, the data corresponding to the second bank address AX_B1<i:0> is loaded on the second bank global data line GDL_B1<15:0> in synchronization with the rising edge of the second bank clock B1_DCLK.

The first bank data input delay clock signal CKCOL_DIN_B0 and the second bank data input delay clock signal CKCOL_DIN_B1 include a pulse in synchronization with the falling edge of the data pass sync strobe clock signal DQS_DP, the first bank data input delay clock signal CKCOL_DIN_B0 and the second bank data input delay clock signal CKCOL_DIN_B1 having twice the clocking cycle of the data pass sync strobe clock signal DQS_DP. In the case where the set value of the data output delay signal LAT_OUT<1:0> is '00', in the data input operation period, the first bank data input delay clock signal CKCOL_DIN_B0 is set to include a pulse from the second falling edge of the data pass sync strobe clock signal DQS_DP, and the second bank data input delay clock signal CKCOL_DIN_B1 is set to include a pulse from the third falling edge of the data pass sync strobe clock signal DQS_DP. Further, the value of the first bank address AX_B0<i:0> changes in synchronization with the rising edge of the first bank data input delay clock signal CKCOL_DIN_B0, and the value of the second bank data input delay clock signal changes in synchronization of the rising edge of the second bank data input delay clock signal CKCOL_DIN_B1

The first data bank input select signal SEL_ENH_B0 and the second bank data input select signal SEL_ENH_B1 include a pulse in synchronization with the falling edge of the data pass sync strobe clock signal DQS_DP, the first data bank input select signal SEL_ENH_B0 and the second bank data input select signal SEL_ENH_B1 having twice the clocking cycle of the data pass sync strobe clock signal DQS_DP. The first bank data input select signal SEL_ENH_B0 is set to include a pulse from the second falling edge of the data pass sync strobe clock signal DQS_DP and the second bank data input select signal SEL_ENH_B1 is set to include a pulse from the third falling edge of the data pass sync strobe clock signal DQS_DP in the data input operation period in the case where the set value of the data output delay signal is '00'.

The page buffer 230 stores the data loaded on the first bank global data line GDL_B0<15:0> and transmitted in a location corresponding to the first bank address AX_B0<i:0> in synchronization with the first bank data input select signal SEL_ENH_B0. Further, the page buffer 230 stores the data loaded on the second bank global data line GDL_B1<15:0> and transmitted in a location corresponding to the second bank address AX_B1<1:0> in synchronization with the second bank data input select signal SEL_ENH_B1.

Figure 17:
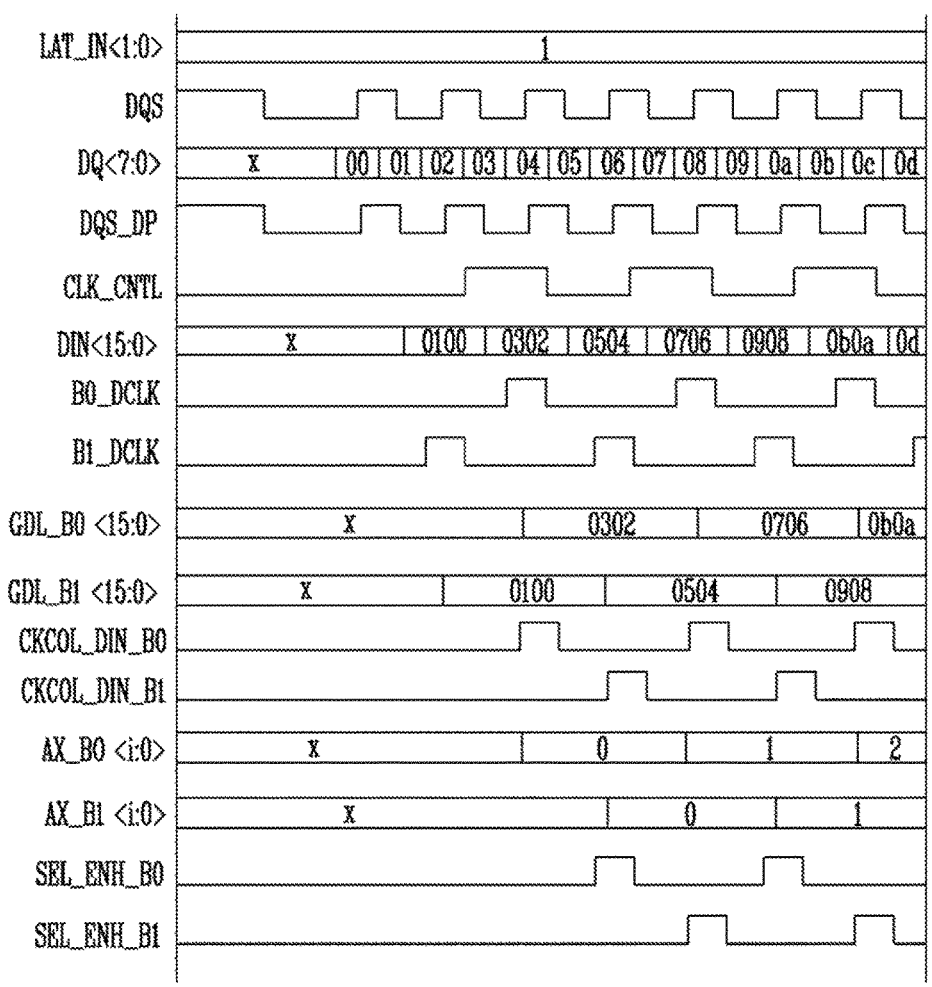
FIG. 17 is a diagram illustrating a data input timing in the case where a set value of a data input delay signal is '01' according to another embodiment of the present disclosure.

FIG. 17 is a diagram illustrating the input timing in the case where the set value of the input delay signal is '01' according to another embodiment of the present disclosure.

Referring to FIG. 17, the initial status of the control clock signal CLK_CNTL during the data input operation period in the case where the set value of the data output delay signal LAT_OUT<1:0> is '01', that is, '1' may be set to be low unlike in the case where the set value of the data output delay signal LAT_OUT<1:0> is '00'. Therefore, the second bank clock B1_DCLK may be activated prior to the first bank clock B0_DCLK.

The first bank data input select signal SEL_ENH_B0 and the first bank data input delay clock signal CKCOL_D-IN_B0 in the case where the set value of the data output delay signal LAT_OUT<1:0> is '01', that is, '1' may include the first pulse in the third falling edge of the data pass sync strobe clock signal DQS_DP. Here, the second data input select signal SEL_ENH_B1 and the second bank data input delay clock signal CKCOL_DIN_B1 may include the first pulse after performing clocking to the first bank data input delay clock signal CKCOL_DIN_B0 once, that is, in the fourth falling edge of the data pass sync strobe clock signal DQS_DP.

Consequently, the initial 2 byte, that is, '00' and '01' data loaded on the second bank global data line GDL_B1<15:0> is processed as dummy data and is thus not stored in the page buffer 230, but only data starting from '02' data is stored in the page buffer 230.

Figure 18:
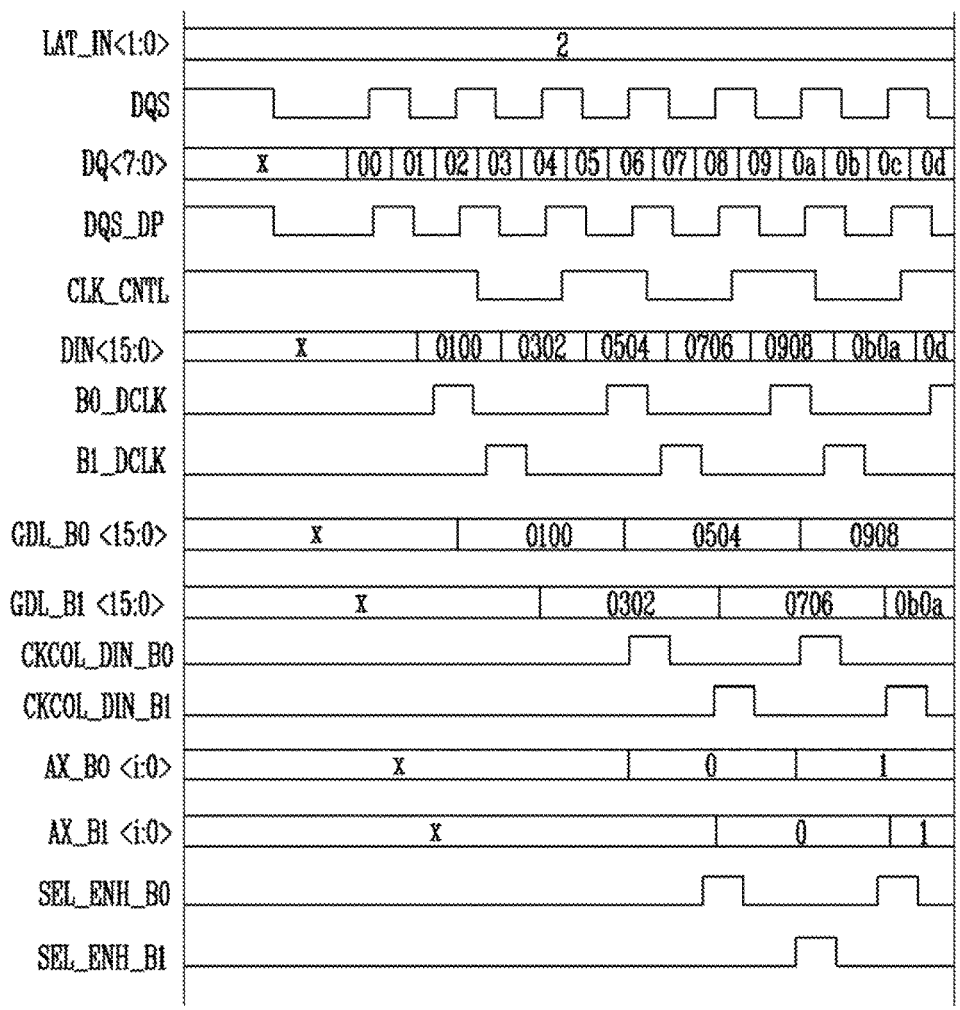
FIG. 18 is a diagram illustrating a data input timing in the case where a set value of a data input delay signal is '10' according to another embodiment of the present disclosure.

FIG. 18 is a diagram illustrating the data input timing in the case where the set value of the data input delay signal is '10' according to another embodiment of the present disclosure.

Referring to FIG. 18, the initial status of the control clock signal CLK_CNTL in the data input operation period in the case where the set value of the data output delay signal LAT_OUT<1:0> is '10', that is, '2', may be set to be high. Therefore, the first bank clock B0_DCLK may be activated prior to the second bank clock B1_DCLK.

In the case where the set value of the data output delay signal LAT_OUT<1:0> is '10', that is, '2', in the data input operation period, the first bank data input select signal SEL_ENH_B0 and the first bank data input delay clock signal CKCOL_DIN_B0 may include the first pulse in the fourth falling edge of the data pass sync strobe clock signal DQS_DP. Here, the second bank data input select signal SEL_ENH_B1 and the second bank data input delay clock signal CKCOL_DIN_B1 may include the first pulse after performing clocking to the first bank data input select signal SEL_ENH_B0 and the first bank data input delay clock signal CKCOL_DIN_B0 once, that is, in the fifth falling edge of the data pass sync strobe clock signal DQS_DP.

Consequently, the initial 2 byte, that is, '00' and '01' data, loaded on the first bank global data line GDL_B0<15:0>, and the initial 2 byte data, that is, '02' and '03', loaded on the second bank global data line GDL_B1<15:0> are processed as dummy data, and thus, the initial 4 byte is not stored in the page buffer 230, but only data starting from '04' is stored in the page buffer 230.

Figure 19:
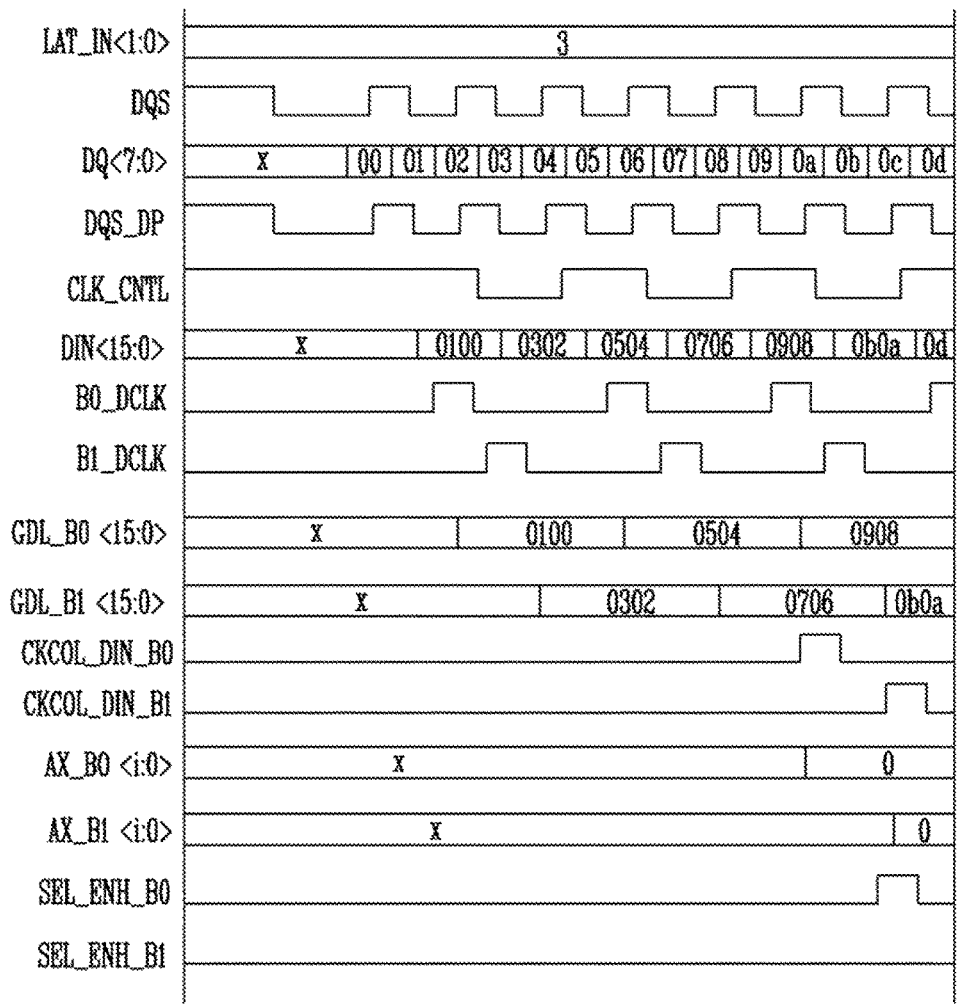
FIG. 19 is a diagram illustrating a data input timing in the case where a set value of a data input delay signal is '11' according to another embodiment of the present disclosure.

FIG. 19 is a diagram illustrating the data input timing in the case where the set value of the data input delay signal is '11' according to another embodiment of the present disclosure.

Referring to FIG. 19, in the case where the set value of the data output delay signal LAT_OUT<1:0> is '11', that is', '3', in the data input operation period, the initial status of the control clock signal CLK_CNTL may be set to be high. Therefore, the first bank clock B0_DCLK is activated prior to the second bank clock B1_DCLK.

In the case where the set value of the data output delay signal LAT_OUT<1:0> is '11', that is '3', during the data input operation, the first bank data input select signal SEL_ENH_B0 and the first bank data input delay clock signal CKCOL_DIN_B0 may include the first pulse in the sixth falling edge of the data pass sync strobe clock signal DQS_DP. Here, the second bank data input select signal SEL_ENH_B1 and the second bank data input delay clock signal CKCOL_DIN_B1 may include the first pulse after performing clocking to the first bank data input select signal SEL_ENH_B0 and the first bank data input delay clock signal CKCOL_DIN_B0 once, that is, in the seventh falling edge of the data pass sync strobe clock signal DQS_DP.

Consequently, the initial 4 byte, that is, '00', '01', '04' and '05' data, loaded on the first bank global data line GDL_B0<15:0> and the initial 4 byte, that is '02', '03', '06' and '07' data, loaded on the second bank global data line GDL_B1<15:0> are processed as dummy data, and thus the initial 8 byte is not stored in the page buffer 230, but data starting from '08' is stored in the page buffer 230.

Figure 20:
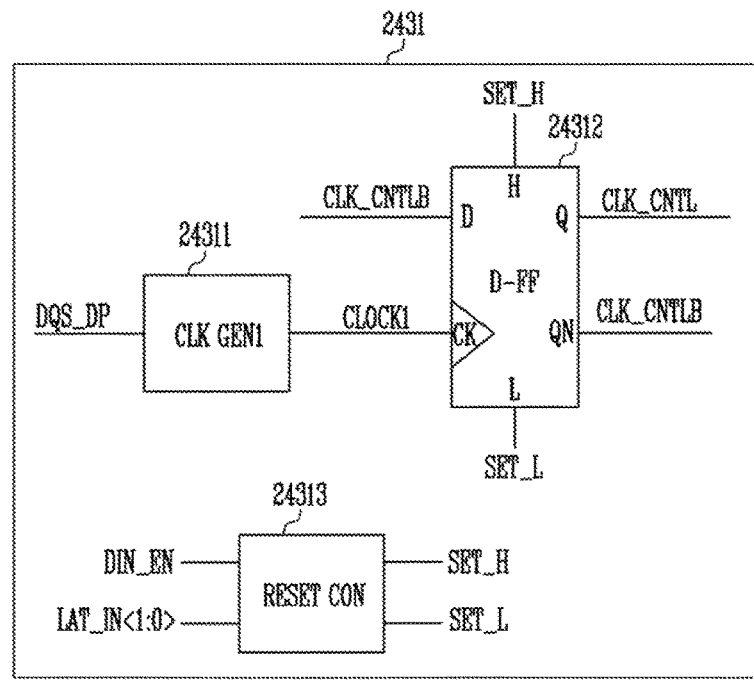
FIG. 20 is a diagram illustrating the data input clock controller of FIG. 13 according to another embodiment of the present disclosure.

FIG. 20 is a diagram illustrating the data input clock controller 2431 of FIG. 13 according to another embodiment of the present disclosure.

Referring to FIG. 20, the data input clock controller DIN CLK CNTL 2431 may include a first clock generator CLK GEN1 24311. The first clock generator CLK GEN1 24311 may receive the data pass sync strobe clock signal DQS_DP and generate the first clock signal CLOCK1 in response to the data pass sync strobe clock signal DQS_DP.

Further, the data input clock controller DIN CLK CNTL 2431 may include a reset control circuit RESET CON 24313. The reset control circuit RESET CON 24313 generates a set high SET_H and a set low SET_L. During the period where the data input enable signal DIN_EN is activated, the set high SET_H and the set low SET_L may change according to the data input delay signal LAT_IN<1:0>.

Further, the data input clock controller DIN CLK CNTL 2431 may include a D type flip-flop D-FF 24312. The D type flip-flop D-FF 24312 may generate a control clock signal CLK_CNTL. The control clock signal CLK_CNTL may be generated according to a first clock signal CLOCK1 and a reverse control clock signal CLK_CNTLB generated according to the first clock signal CLOCK1, and may change according to the set high SET_H and the set low SET_L. Consequently, the control clock signal CLK_CNTL may change according to the data input delay signal LAT_IN<1: 0>.

Figure 21:
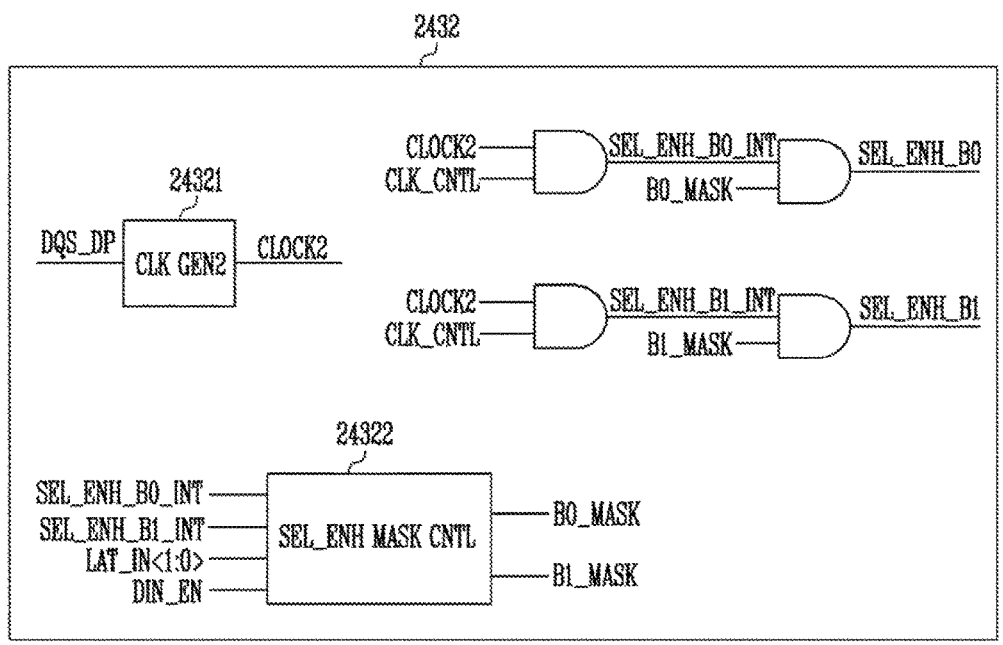
FIG. 21 is a diagram illustrating the data input clock generator of FIG. 13 according to another embodiment of the present disclosure.

FIG. 21 is a diagram illustrating the data input clock generator 2432 of FIG. 13 according to another embodiment of the present disclosure.

Referring to FIG. 21, the data input clock generator DIN CLK GEN 2432 may include a second clock generator CLK GEN2 24321. The second clock generator CLK GEN2 24321 may receive the data pass sync strobe clock signal DQS_DP, and generate a second clock signal CLOCK2 in response to the data pass sync strobe clock signal DQS_DP.

The data input clock generator DIN CLK GEN 2432 may include a bank select mask controller SEL_ENH MASK CNTL 24322. The bank select mask controller SEL_ENH MASK CNTL 24322 may generate a first bank mask signal B0_MASK and a second bank mask signal B1_MASK. The first bank mask signal B0_MASK may change according to an inner first bank data input select signal SEL_ENH_B0_INT and a data input delay signal LAT_IN<1:0>. The inner first bank data input select signal SEL_ENH_B0_INT is generated by performing an AND operation on the second clock signal CLOCK2 and the control clock signal CLK_CNTL. The second bank mask signal B1_MASK may change according to an inner second bank data input select signal SEL_ENH_B1_INT and the data input delay signal LAT_IN<1:0>. The inner second bank data input select signal SEL_ENH_B1_INT is generated by performing an AND operation on the second clock signal CLOCK2 and the control clock signal CLK_CNTL.

The first bank data input select signal SEL_ENH_B0 may be generated by performing an AND operation on the inner first bank data input select signal SEL_ENH_B0_INT and the first bank mask signal B0_MASK. Further, the second bank data input select signal SEL_ENH_B1 may be generated by performing an AND operation on the inner second bank data input select signal SEL_ENH_B1_INT and the second bank mask signal B1_MASK.

Figure 22:
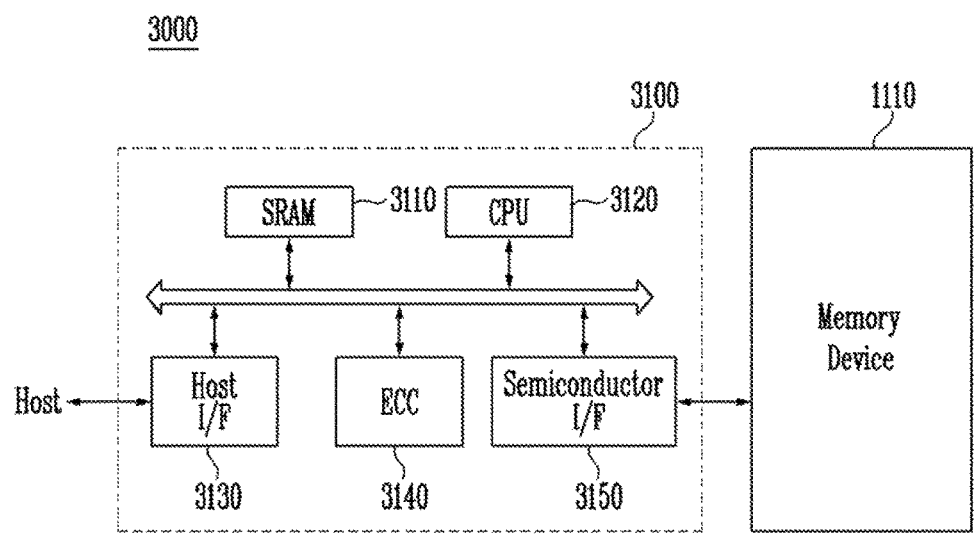
FIG. 22 is a diagram illustrating a memory system that includes a memory device according to an embodiment of the present disclosure.

FIG. 22 is a diagram illustrating a memory system 3000 that includes a memory device 1110 according to an embodiment of the present disclosure.

Referring to FIG. 22, the memory device 1110 may be configured substantially the same as in FIG. 1, and thus detailed explanation on the memory device 1110 will be omitted.

The controller 3100 may be configured to transmit data into the memory device 1110 and to receive data output from the memory device. The controller 3100 may transmit the data strobe clock signal DQS into the memory device 1110, and transmit program data through the data I/O pins DQ<7: 0> in synchronization with the data strobe clock signal DQS. Further, the controller 3100 may transmit the read enable clock signal RE_N into the memory device 1110, and receive read data from the memory device 1110 through the data I/O pins DQ<7:0>. Further, the controller 3100 may be configured to control the memory device 1110. A static random access memory (SRAM) 3110 may be used as a working memory of a central processing unit (CPU) 3120. The host interface (Host I/F) 3130 may be equipped with a data exchange protocol of a host being connected to the memory system 3000. An error correcting circuit (ECC) 3140 provided in the controller 3100 may detect and correct an error included in the data read from the memory device 1110. A semiconductor interface (Semiconductor I/F) 3150 may perform interfacing with the memory device 1110. The CPU 3120 may perform control operations for data exchanging of the controller 3100. Further, although not illustrated in FIG. 11, a read only memory (ROM) for storing code data for interfacing with the host may be further provided.

The memory system 3000 according to the present disclosure may be applied to one of a computer, Ultra Mobile PC (UMPC), workstation, net-book, personal digital assistant (PDA), portable computer, web tablet, wireless phone, mobile phone, smart phone, digital camera, digital audio recorder, digital audio player, digital picture recorder, digital picture player, digital video recorder, digital video player, a device configured to transceiver information in a wireless environment and various devices forming a home network.

Figure 23:
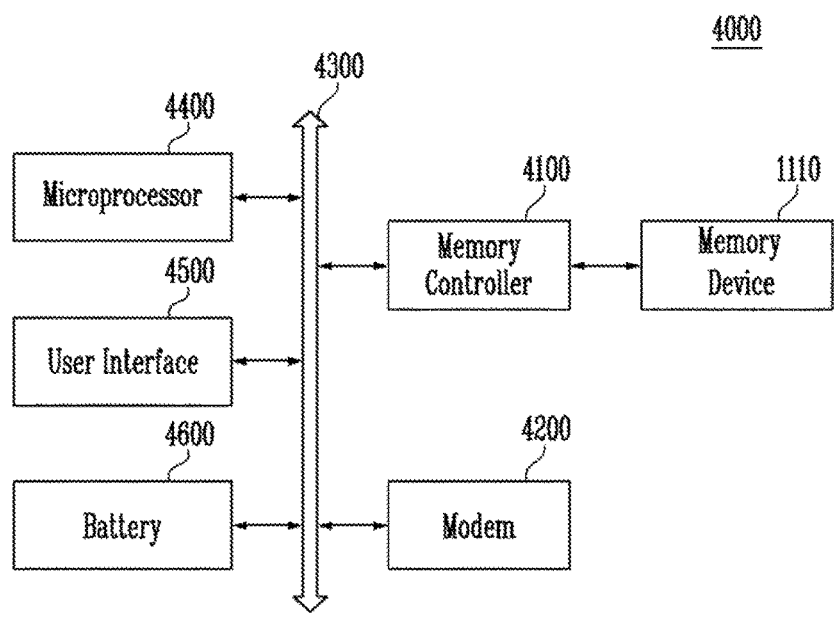
FIG. 23 is a diagram illustrating a computing system that includes a memory device according to an embodiment of the present disclosure.

FIG. 23 is a diagram illustrating a computing system 4000 that includes a memory device 1110 according to an embodiment of the present disclosure.

Referring to FIG. 23, the computing system 4000 includes the memory device 1110, a memory controller 4100, a modem 4200, a microprocessor 4400 and a user interface 4500 electrically connected to a bus 4300. In the case where the computing system 4000 is a mobile device, a battery 4600 for supplying operating voltage of the computing system 4000 may be further provided. Although not illustrated in the drawings, the computing system 4000 may further include an application chip set, a camera image processor (CIS) and a mobile dynamic random access memory (DRAM), etc.

The memory device 1110 may be configured substantially the same as in FIG. 1, and thus detailed explanation on the memory device 1110 is omitted.

The controller 4100 and the memory device 1110 may form a solid state drive/disk (SSD).

The system according to the present disclosure may be mounted using various forms of packages. For example, the system according to the present disclosure may be mounted using packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP) and Wafer-Level Processed Stack Package (WSP), etc.

In the drawings and specification, there have been disclosed typical embodiments of the invention, and although specific terms are employed, they are used in a generic and descriptive sense only and not for purposes of limitation. It will be understood by those of ordinary skill in the art that various changes in form and details may be made therein without departing from the spirit and scope of the present invention as defined by the following claims.

What is claimed is:

1. A memory device comprising:
a data output controller configured to generate first and second clock signals in response to a read enable clock signal received from an external device during a data output operation;
a page buffer configured to output data to the data output controller in synchronization with the first clock signal; and
a data output buffer configured to receive the data from the page buffer and to output the received data to the external device in synchronization with the second clock signal, wherein the first clock signal is generated in response to a data output delay control signal, wherein the second clock signal is generated irrespective of the data output delay control signal, wherein a time point of outputting the data to the external device is changed according to a set value of the data output delay control signal, wherein a cycle of the first clock signal during the data output operation is twice a cycle of the second clock signal, and wherein a time point of generating a first rising edge of the first clock signal is changed according to the set value of the data output delay control signal during the data output operation.

2. The memory device according to claim 1, further comprising:

a column address generation controller configured to generate and change a column address in synchronization with the first clock signal, and wherein the page buffer outputs the data in response to the column address.

3. The memory device according to claim 2, wherein the first clock signal includes a plurality of repeated pulses in a dummy read operation period prior to the data output operation, and wherein the page buffer transmits a portion of the data to the data output controller in response to the plurality of repeated pulses.

4. The memory device according to claim 1, wherein the data output controller comprises:

a pipe latch configured to receive the data from the page buffer through a first and a second data line and to store the received data;

a data output delay controller configured to receive the data from the pipe latch through a third data line; and wherein the page buffer transmits a portion of the data to the first data line and another portion of the data to the second data line in response to a rising edge of the first clock signal.

5. The memory device according to claim 4, wherein the data output delay controller generates a first pipe select bank signal and a second pipe select bank signal in response to the second clock signal, the first pipe bank select signal includes a pulse in response to an odd number falling edge of the second clock signal during the data output operation, and the second pipe bank select signal includes a pulse in response to an even number falling edge of the second clock signal during the data output operation.

6. The memory device according to claim 5, wherein a status of the first pipe select bank signal and the second pipe select bank signal at a starting time point of the data output operation is changed according to the set value of the data output delay control signal.

7. The memory device according to claim 5, wherein the pipe latch transmits the stored data to the data output delay controller through the third data line in synchronization with one of the first pipe bank select signal and the second pipe bank select signal, and wherein the data output delay controller generates a first pipe output bank signal in response to an odd number rising edge of the second clock signal during the data output operation, and generates a second pipe output bank signal in response to an even number rising edge of the second clock signal.

8. The memory device according to claim 7, wherein the first pipe output bank signal and the second pipe output bank signal control the pipe latch, initial values of the first pipe output bank signal and the second pipe output bank signal at a starting time point of the data output operation is changed according to the set value of the data output delay control signal.

9. The memory device according to claim 6, wherein the data output controller generates a third clock signal in synchronization with the second clock signal, irrespective of the data output delay control signal, and the data output delay controller outputs the data to the data output buffer in synchronization with the third clock signal.

10. The memory device according to claim 9, wherein the data output delay controller outputs a portion of the data to the data output buffer through a fourth data line in synchronization with a rising edge of the third clock signal, and outputs another portion of the data to the data output buffer through a fifth data line in synchronization with a falling edge of the third clock signal.

11. The memory device according to claim 10, further comprising:

a clock input buffer configured to generate a fourth clock signal in synchronization with a rising edge of the read enable clock signal, irrespective of the data output delay control signal, and to generate a fifth clock signal in synchronization with a falling edge of the read enable clock signal, irrespective of the data output delay control signal, and wherein the data output buffer outputs the data to the external device in synchronization with the fourth clock signal and the fifth clock signal.

12. A memory device comprising:

a data input buffer configured to receive a data strobe clock signal and data in synchronization with the data strobe clock signal from an external device during a data input operation, and to generate a first clock signal in response to the data strobe clock signal;

a data input delay controller configured to receive the data output from the data input buffer in synchronization with the first clock signal, and to generate one or more second clock signals in response to the first clock signal and under a control by a data input delay signal; and a page buffer configured to receive the data from the data input delay controller, and to store the data in synchronization with the one or more second clock signals, wherein the first clock signal is generated irrespective of the data input delay signal, wherein a column address generation controller configured to generate and change a column address in response to a third clock signal, wherein a portion of the data having a certain size is processed as dummy data instead of being stored in the page buffer according to a set value of the data input delay signal, and wherein the page buffer stores the data in response to the column address.

13. The memory device according to claim 12, wherein a time point of generating a first rising edge of the third clock signal is changed according to the set value of the data input delay signal during the data input operation.

14. The memory device according to claim 12,
wherein a time point of generating a first rising edge of the one or more second clock signals is changed according to the set value of the data input delay signal during the data input operation,
wherein the data input delay controller generates a fourth clock signal in synchronization with a falling edge of the first clock signal, a cycle of the fourth clock signal being twice that of the first clock signal, and
wherein a status of the fourth clock signal at a starting time point of the data input operation is changed according to the set value of the data input delay signal.

15. The memory device according to claim 12,
wherein one or more fifth clock signals are generated in response to the first clock signal, and the data is outputted to the page buffer in synchronization with the one or more fifth clock signals.

16. The memory device according to claim 15,
wherein the one or more second clock signals comprise a second odd clock signal and a second even clock signal,
the second odd clock signal is generated in synchronization with an odd number falling edge of the first clock signal during the data input operation, and
the second even clock signal is generated in synchronization with an even number falling edge of the first clock signal during the data input operation.

17. The memory device according to claim 16,
wherein the one or more fifth clock signals comprise a fifth odd clock signal and a fifth even clock signal,
the fifth odd clock signal is generated in synchronization with the odd number falling edge of the first clock signal during the data input operation, and
the fifth even clock signal is generated in synchronization with the even number falling edge of the first clock signal during the data input operation.

18. The memory device according to claim 17,
wherein the data input delay controller transmits a portion of the data to the page buffer through a first transmission line in synchronization with the fifth odd clock signal, and
transmits another portion of the data to the page buffer through a second transmission line in synchronization with the fifth even clock signal.

\* \* \* \* \*